US012119077B2

United States Patent
Lin

(10) Patent No.: US 12,119,077 B2
(45) Date of Patent: Oct. 15, 2024

(54) CIRCUIT FOR RECEIVING DATA, SYSTEM FOR RECEIVING DATA, AND MEMORY DEVICE

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 68 days.

(21) Appl. No.: 17/934,695

(22) Filed: Sep. 23, 2022

(65) Prior Publication Data
US 2024/0005965 A1 Jan. 4, 2024

Related U.S. Application Data

(63) Continuation of application No. PCT/CN2022/107622, filed on Jul. 25, 2022.

(30) Foreign Application Priority Data

Jul. 4, 2022 (CN) .......................... 202210787529.7

(51) Int. Cl.
G11C 7/06 (2006.01)
G11C 7/10 (2006.01)
G11C 7/22 (2006.01)

(52) U.S. Cl.
CPC ............ G11C 7/067 (2013.01); G11C 7/1063 (2013.01); G11C 7/222 (2013.01)

(58) Field of Classification Search
CPC ....... G11C 7/067; G11C 7/1063; G11C 7/222; G11C 7/1087; G11C 11/4096; G11C 7/1084; H04L 25/03885; H04L 25/03057
(Continued)

(56) References Cited

U.S. PATENT DOCUMENTS 6,504,778 B1 1/2003 Uekubo
8,149,953 B2 4/2012 Kim et al.
(Continued)

FOREIGN PATENT DOCUMENTS

CN 104183258 A 12/2014
CN 110649934 A 1/2020
(Continued)

OTHER PUBLICATIONS

US office action in U.S. Appl. No. 17/936,107, mailed on May 22, 2024.
(Continued)

*Primary Examiner* — Fernando Hidalgo
(74) *Attorney, Agent, or Firm* — Syncoda LLC; Feng Ma

(57) ABSTRACT

Embodiments of the present disclosure provide a circuit for receiving data, a system for receiving data, and a memory device. The circuit for receiving data includes: a first amplification module, including: an amplification unit, provided with a first node, a second node, a third node, and a fourth node; a first N-channel metal oxide semiconductor (NMOS) transistor and a second NMOS transistor, the first NMOS transistor being provided with one terminal connected to the first node and another terminal connected to one terminal of the second NMOS transistor, another terminal of the second NMOS transistor being connected to the second node, a gate of one of the first NMOS transistor and the second NMOS transistor being configured to receive a first complementary feedback signal, and a gate of the other one of the first NMOS transistor and the second NMOS transistor being configured to receive an enable signal.

20 Claims, 7 Drawing Sheets

(58) Field of Classification Search
USPC .................................................. 365/185.21
See application file for complete search history.

(56) References Cited

U.S. PATENT DOCUMENTS

| | | |
|---|---|---|
| 8,391,347 B2 | 3/2013 | Kim et al. |
| 8,964,444 B2 | 2/2015 | Hall |
| 9,515,657 B2 | 12/2016 | Ecker et al. |
| 10,447,508 B2 | 10/2019 | Sreeramaneni et al. |
| 10,651,829 B2 | 5/2020 | Kim |
| 11,615,833 B2 | 3/2023 | Shin |
| 2007/0201291 A1 | 8/2007 | Cho |
| 2008/0089155 A1 | 4/2008 | Bae |
| 2009/0116596 A1 | 5/2009 | Oh et al. |
| 2009/0128214 A1 | 5/2009 | Kim et al. |
| 2012/0063242 A1* | 3/2012 | Kim .................. G11C 7/1087 365/189.05 |
| 2020/0274741 A1 | 8/2020 | Kang |
| 2021/0174844 A1 | 6/2021 | Choi et al. |
| 2021/0408970 A1 | 12/2021 | Hong et al. |
| 2022/0068356 A1 | 3/2022 | Shin et al. |

FOREIGN PATENT DOCUMENTS

| | | | | |
|---|---|---|---|---|
| CN | 112204662 A | 1/2021 | | |
| CN | 113852367 A | 12/2021 | | |
| CN | 114121062 A | 3/2022 | | |
| CN | 117393009 A * | 1/2024 | ......... | G11C 11/4096 |
| JP | 2015228540 A | 12/2015 | | |
| JP | 2018061164 A | 4/2018 | | |
| KR | 1020090044055 A | 5/2009 | | |
| WO | 200711035 A1 | 10/2007 | | |

OTHER PUBLICATIONS

JP patent office in application No. 2022-556265, mailed on Sep. 3, 2024.

* cited by examiner

US 12,119,077 B2

CIRCUIT FOR RECEIVING DATA, SYSTEM FOR RECEIVING DATA, AND MEMORY DEVICE

CROSS-REFERENCE TO RELATED APPLICATIONS

This is a continuation of International Application No. PCT/CN2022/107622, filed on Jul. 25, 2022, which claims the priority to Chinese Patent Application No. 202210787529.7, titled "CIRCUIT FOR RECEIVING DATA, SYSTEM FOR RECEIVING DATA, AND MEMORY DEVICE" and filed on Jul. 4, 2022. The entire contents of International Application No. PCT/CN2022/107622 and Chinese Patent Application No. 202210787529.7 are incorporated herein by reference.

TECHNICAL FIELD

Embodiments of the present disclosure relate to the technical field of semiconductors, and in particular, to a circuit for receiving data, a system for receiving data, and a memory device.

BACKGROUND

In memory applications, as a signal transmission rate becomes increasingly fast, a channel loss has a greater impact on signal quality, which easily leads to intersymbol interference. In addition, a difference in level between a data signal received by a circuit for receiving data in a memory and a reference signal affects judgment of the circuit for receiving data on the data signal, thereby affecting accuracy of a signal outputted by the circuit for receiving data.

At present, an equalization circuit is usually configured to compensate for a channel, and the equalization circuit may select a continuous time linear equalizer (CTLE) or a decision feedback equalizer (DFE). However, the accuracy of the signal outputted by the equalization circuit currently used needs to be improved, receiving performance of the equalization circuit needs to be enhanced, and the processing speed of the equalization circuit to the data signal needs to be accelerated.

SUMMARY

According to some embodiments of the present disclosure, one aspect of the embodiments of the present disclosure provides a circuit for receiving data, including: a first amplification module, configured to: receive an enable signal, a first feedback signal, a second feedback signal, a data signal, a first reference signal, and a second reference signal; when the enable signal is at a first level, in response to a sampling clock signal and on a basis of the first feedback signal, select the data signal and the first reference signal for a first comparison and output a first signal pair as a result of the first comparison, or in response to the sampling clock signal and on a basis of the second feedback signal, select the data signal and the second reference signal for a second comparison and output a second signal pair as a result of the second comparison; and when the enable signal is at a second level, perform the first comparison in response to the sampling clock signal, and output the first signal pair; wherein, a level of the first feedback signal is opposite to a level of the second feedback signal, the first signal pair includes a first signal and a second signal, and the second signal pair includes a third signal and a fourth signal; and the first amplification module includes: an amplification unit, provided with a first node, a second node, a third node and a fourth node, the first node being for outputting the first signal, the second node being for outputting the second signal, the third node being for outputting the third signal, and the fourth node being for outputting the fourth signal, and configured to receive the data signal, the first reference signal, and the second reference signal; a first N-channel metal oxide semiconductor (NMOS) transistor and a second NMOS transistor, the first NMOS transistor being provided with one terminal connected to the first node and another terminal connected to one terminal of the second NMOS transistor, another terminal of the second NMOS transistor being connected to the second node, a gate of one of the first NMOS transistor and the second NMOS transistor being configured to receive a first complementary feedback signal, a gate of the other one of the first NMOS transistor and the second NMOS transistor being configured to receive the enable signal, and a level of the first complementary feedback signal being opposite to the level of the first feedback signal; and a third NMOS transistor and a fourth NMOS transistor, the third NMOS transistor being provided with one terminal connected to the third node and another terminal connected to one terminal of the fourth NMOS transistor, another terminal of the fourth NMOS transistor being connected to the fourth node, a gate of one of the third NMOS transistor and the fourth NMOS transistor being configured to receive a second complementary feedback signal, a gate of the other one of the third NMOS transistor and the fourth NMOS transistor being configured to receive the enable signal, and a level of the second complementary feedback signal being opposite to the level of the second feedback signal; and a second amplification module, configured to receive output signals of the first amplification module as an input signal pair, perform an amplification processing on a voltage difference of the input signal pair, and output a first output signal and a second output signal as a result of the amplification processing.

According to some embodiments of the present disclosure, another aspect of the embodiments of the present disclosure further provides a system for receiving data, including: a plurality of cascaded data transmission circuits, wherein each of the data transmission circuits includes the circuit for receiving data as described above, and a latch circuit connected to the circuit for receiving data; an output signal of a previous stage data transmission circuit is used as a feedback signal of a next stage data transmission circuit; and an output signal of a last stage data transmission circuit is used as a feedback signal of a first stage data transmission circuit.

According to some embodiments of the present disclosure, another aspect of the embodiments of the present disclosure further provides a memory device, including: a plurality of data ports; and a plurality of systems for receiving data as described above, each of the systems for receiving data corresponding to one of the data ports.

BRIEF DESCRIPTION OF THE DRAWINGS

One or more embodiments are described illustratively by use of corresponding drawings. The illustrative description does not constitute any limitation on the embodiments. Unless otherwise expressly specified, the drawings do not constitute a scale limitation. To describe the technical solutions in the embodiments of the present disclosure or in the conventional technology more clearly, the following simply describes the drawings to be used in the embodiments of the present disclosure. Evidently, the drawings outlined below are merely some embodiments of the present disclosure. A person of ordinary skill in the art may derive other drawings from the outlined drawings without making any creative effort.

DETAILED DESCRIPTION

Embodiments of the present disclosure provide a circuit for receiving data, a system for receiving data, and a memory device. In the circuit for receiving data, the first amplification module may be further controlled using the enable signal, the first feedback signal, and the second feedback signal, to select whether to consider the influence of the intersymbol interference of the data received by the circuit for receiving data on the circuit for receiving data. For example, when the influence of the intersymbol interference on the circuit for receiving data needs to be reduced, when the enable signal is at the first level, the first amplification module selects to perform one of the first comparison and the second comparison in response to the sampling clock signal by using the first NMOS transistor, the second NMOS transistor, the third NMOS transistor, and the fourth NMOS transistor, such that one of the outputted first signal pair and second signal pair is valid, the other one is invalid, and the signal level difference in the valid signal pair is greater, to ensure that the second amplification module receives the pair of differential signals having a greater signal level difference. In addition, the use of a low turn-on resistance of the NMOS transistors prevents the first amplification module from performing the first comparison and the second comparison at the same time and improves the processing effect and processing speed of the first amplification module to the data signal. When the influence of the intersymbol interference on the circuit for receiving data does not need to be considered, when the enable signal is at the second level, the first amplification module only performs the first comparison in response to the sampling clock signal to regularly output the valid first signal pair, thereby reducing the power consumption of the circuit for receiving data.

The embodiments of the present disclosure are described in detail below with reference to the accompanying drawings. However, a person skilled in the art may understand that in each embodiment of the present disclosure, many technical details are proposed to help readers better understand the embodiments of the present disclosure. However, the technical solutions claimed in the embodiments of the present disclosure can still be implemented based on variations and modifications of the following embodiments even without the technical details.

Figure 1:
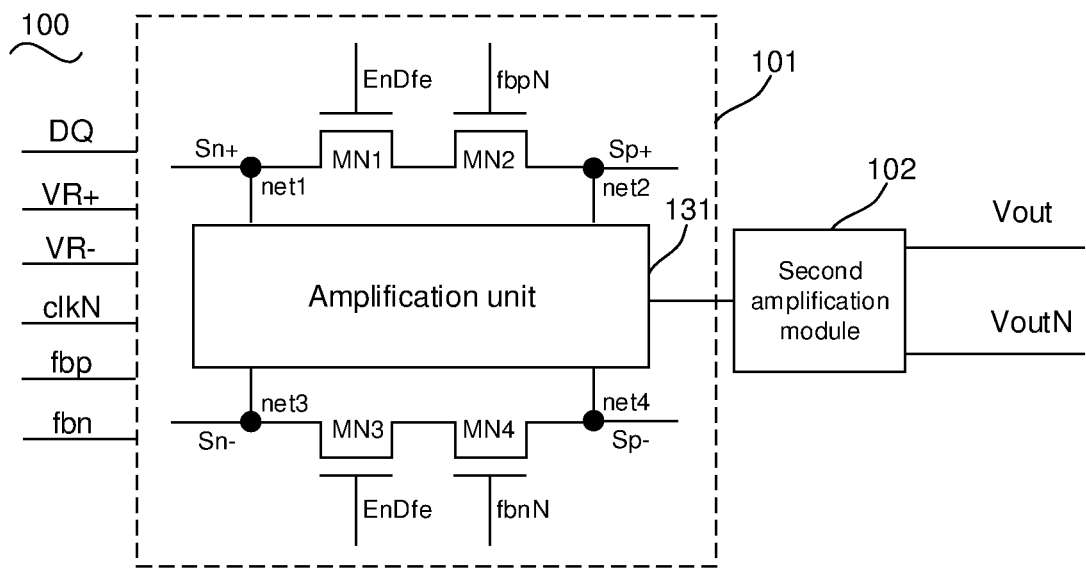
FIG. 1 is a functional block diagram of a circuit for receiving data according to one embodiment of the present disclosure.
Figure 2:
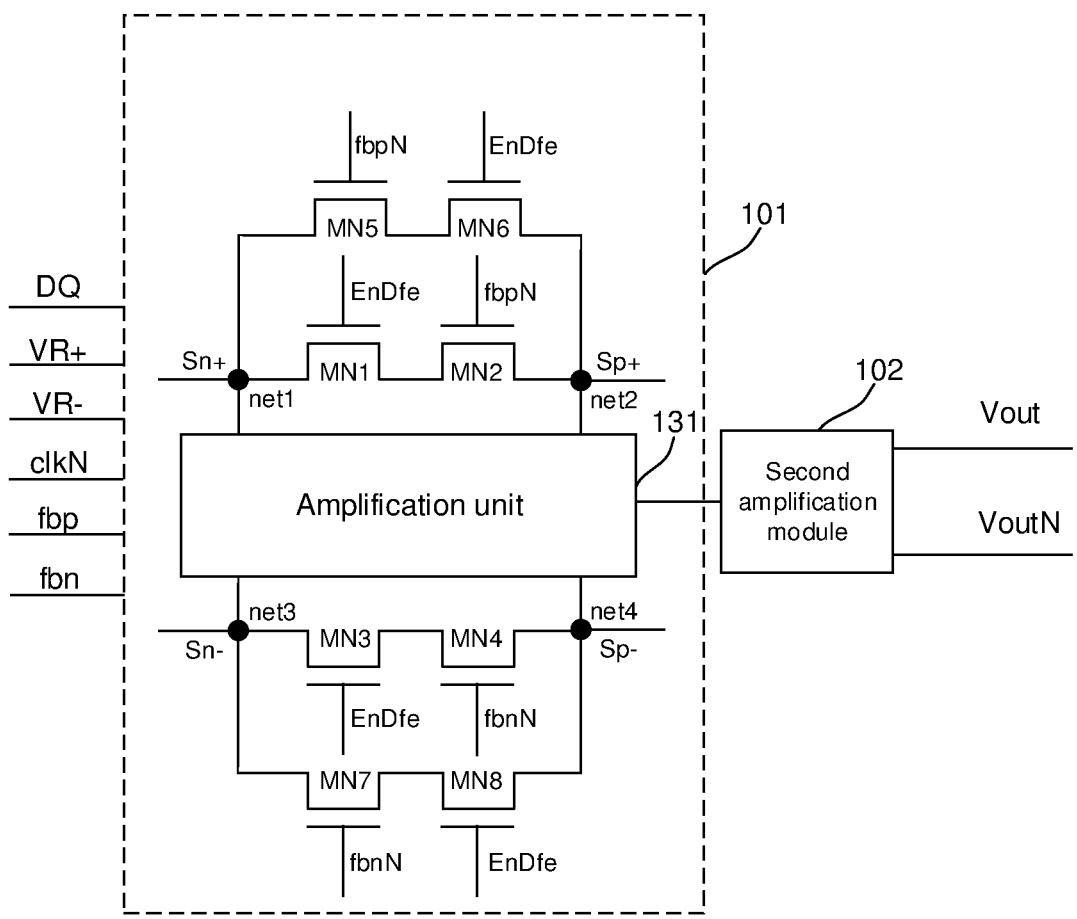
FIG. 2 is another functional block diagram of a circuit for receiving data according to one embodiment of the present disclosure.
Figure 3:
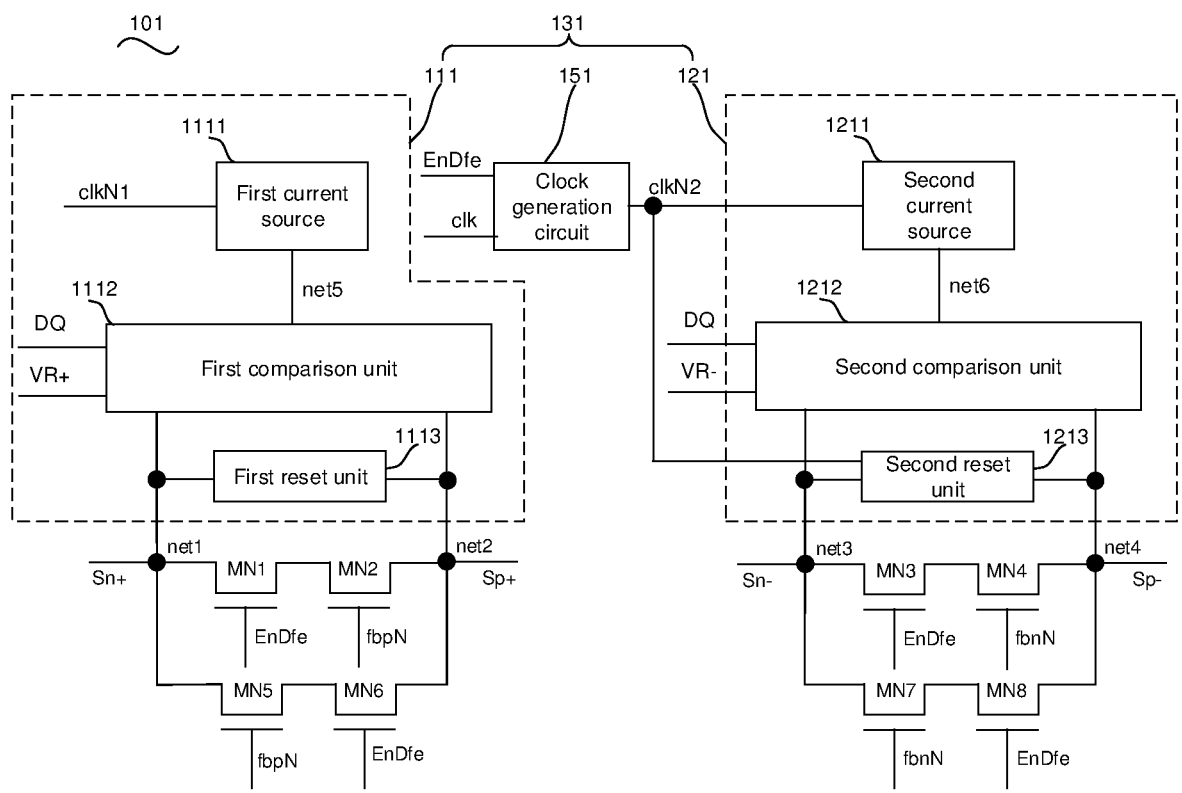
FIG. 3 is a functional block diagram of a first amplification module in a circuit for receiving data according to one embodiment of the present disclosure.
Figure 4:
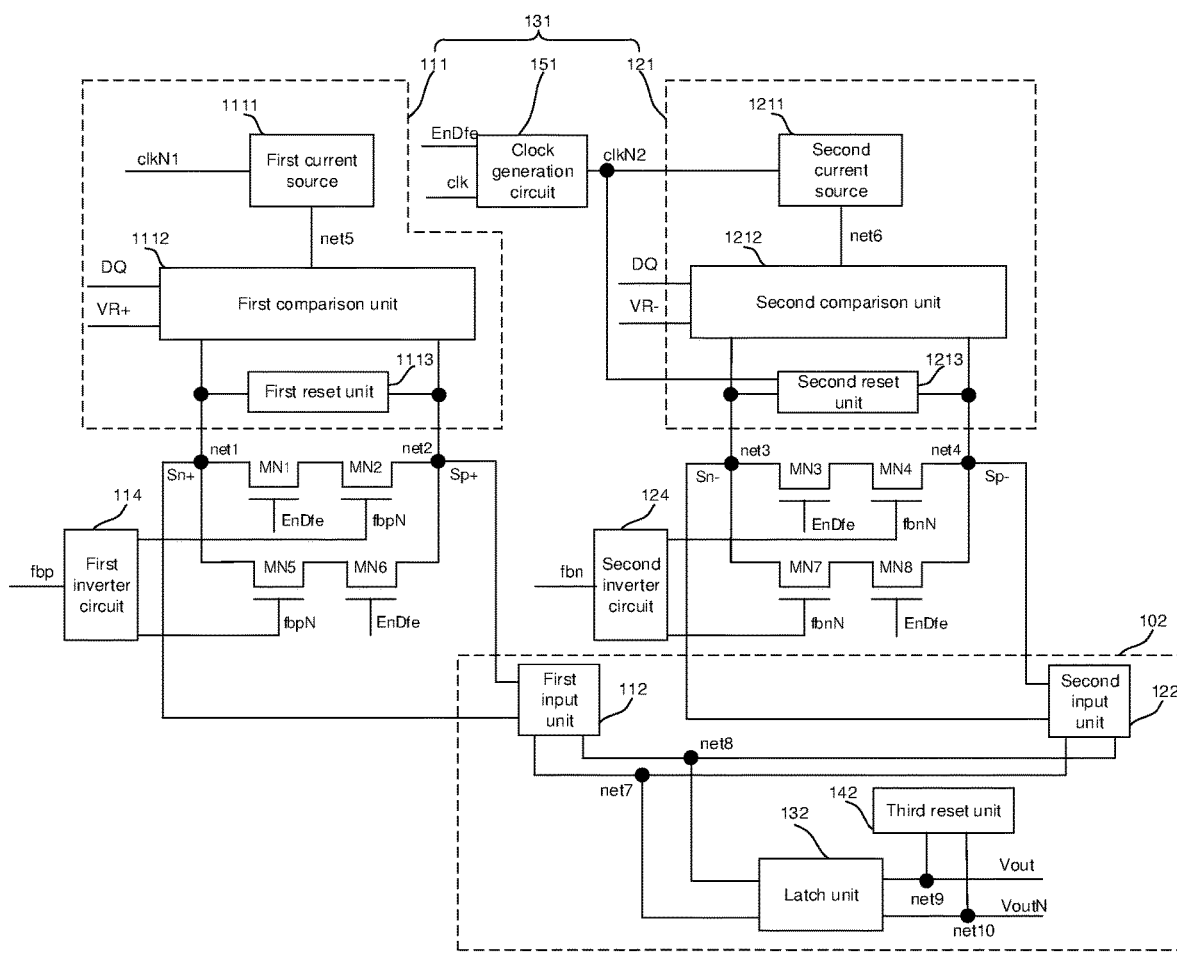
FIG. 4 is another functional block diagram of a circuit for receiving data according to one embodiment of the present disclosure.
Figure 5:
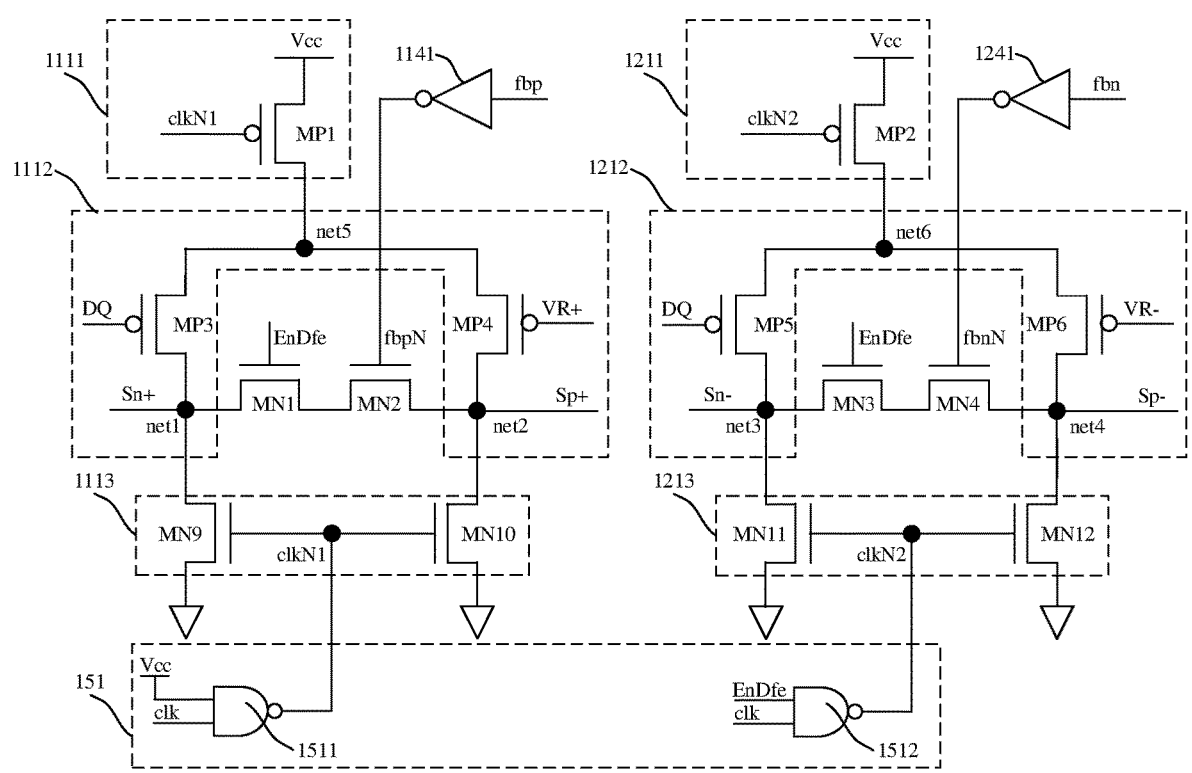
FIG. 5 and FIG. 6 are schematic diagrams of two circuit structures of a first amplification module, a first inverter circuit, and a second inverter circuit in a circuit for receiving data according to one embodiment of the present disclosure.
Figure 6:
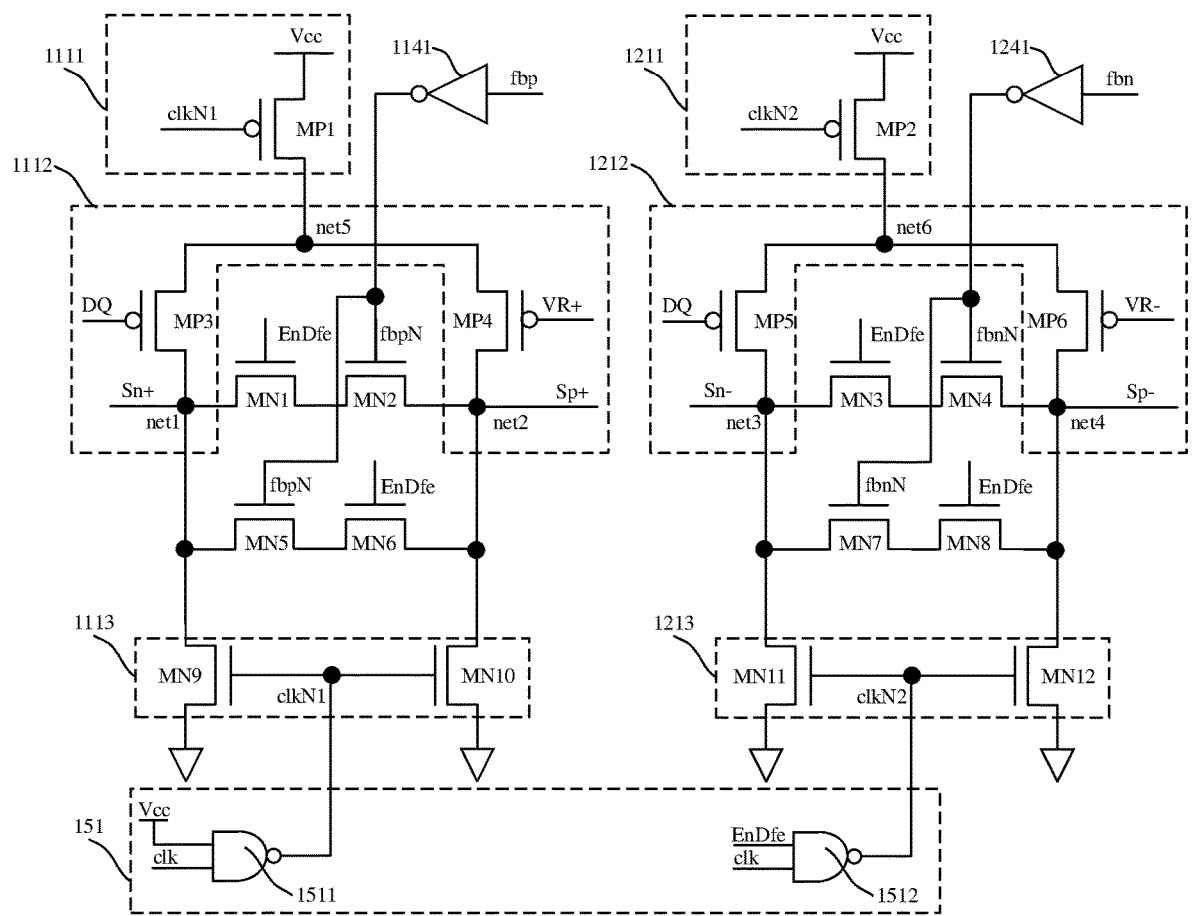
Figure 7:
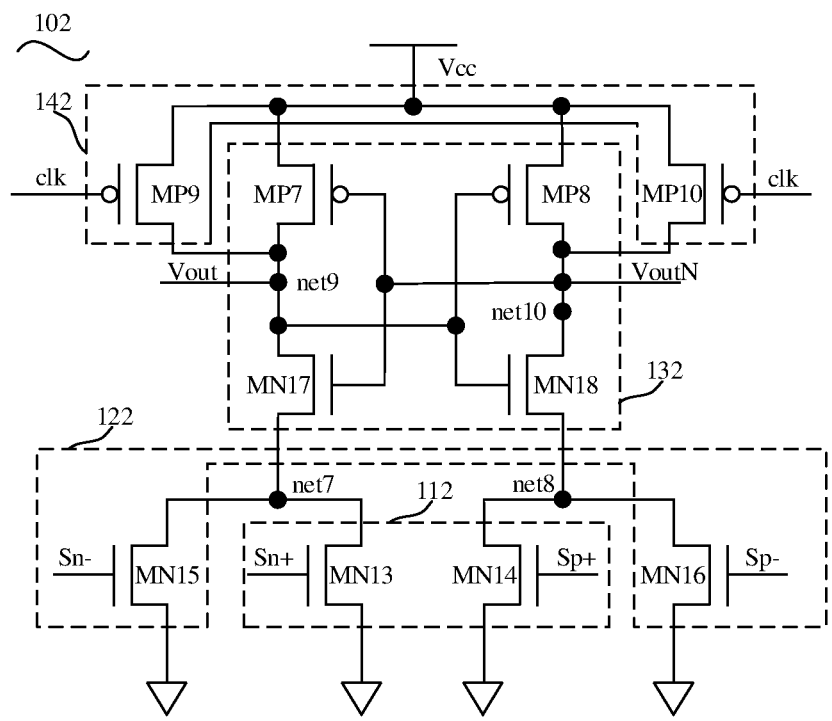
FIG. 7 is a schematic diagram of a circuit structure of a second amplification module in a circuit for receiving data according to one embodiment of the present disclosure.
Figure 8:
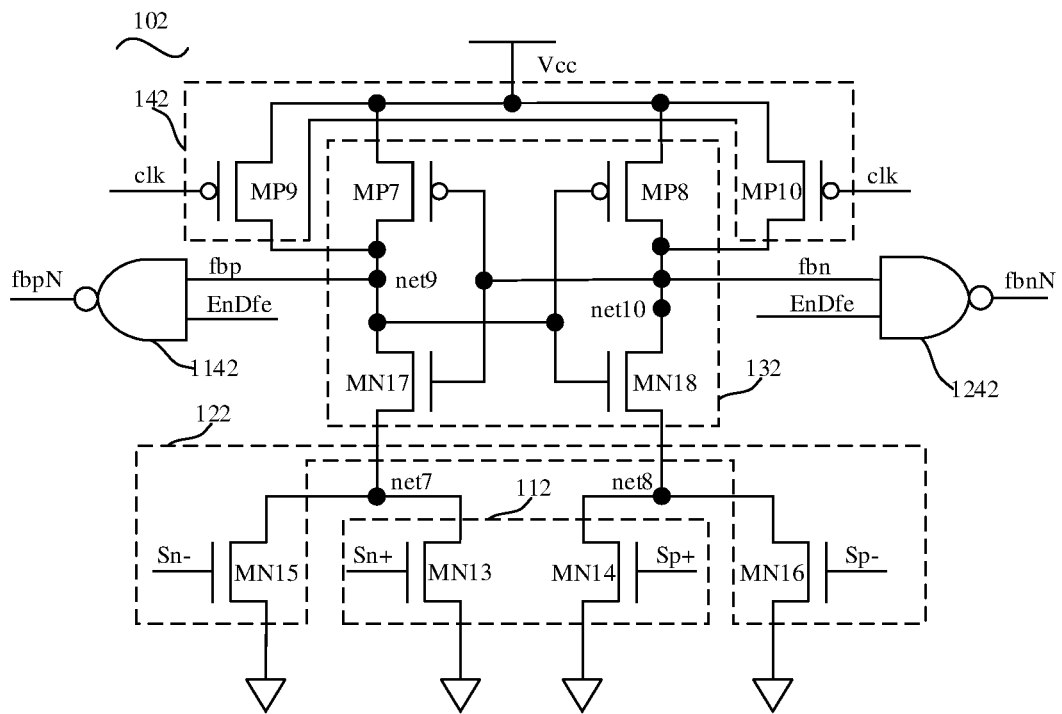
FIG. 8 is a schematic diagram of another circuit structure of a second amplification module, a first inverter circuit, and a second inverter circuit in a circuit for receiving data according to one embodiment of the present disclosure.

One embodiment of the present disclosure provides a circuit for receiving data. The circuit for receiving data provided by one embodiment of the present disclosure will be described in detail below with reference to the accompanying drawings. FIG. 1 is a functional block diagram of a circuit for receiving data according to one embodiment of the present disclosure; FIG. 2 is another functional block diagram of a circuit for receiving data according to one embodiment of the present disclosure; FIG. 3 is a functional block diagram of a first amplification module in a circuit for receiving data according to one embodiment of the present disclosure; FIG. 4 is another functional block diagram of a circuit for receiving data according to one embodiment of the present disclosure; FIG. 5 and FIG. 6 are schematic diagrams of two circuit structures of a first amplification module, a first inverter circuit, and a second inverter circuit in a circuit for receiving data according to one embodiment of the present disclosure; FIG. 7 is a schematic diagram of a circuit structure of a second amplification module in a circuit for receiving data according to one embodiment of the present disclosure; and FIG. 8 is a schematic diagram of another circuit structure of a second amplification module, a first inverter circuit, and a second inverter circuit in a circuit for receiving data according to one embodiment of the present disclosure.

Referring to FIG. 1, the circuit for receiving data 100 may include: a first amplification module 101 configured to: receive an enable signal EnDfe, a first feedback signal fbp, a second feedback signal fbn, a data signal DQ, a first reference signal VR+, and a second reference signal VR−; when the enable signal EnDfe is at a first level, in response to a sampling clock signal clkN and on the basis of the first feedback signal fbp, select the data signal DQ and the first reference signal VR+ for first comparison and output a first signal pair as a result of the first comparison, or in response to the sampling clock signal clkN and on the basis of the second feedback signal fbn, select the data signal DQ and the second reference signal VR− for second comparison and output a second signal pair as a result of the second comparison; and when the enable signal EnDfe is at a second level, perform the first comparison in response to the sampling clock signal clkN, and output the first signal pair; where, a level of the first feedback signal fbp is opposite to a level of the second feedback signal fbn, the first signal pair includes a first signal Sn+ and a second signal Sp+, and the second signal pair includes a third signal Sn− and a fourth signal Sp−.

Still referring to FIG. 1, the first amplification module 101 includes: an amplification unit 131 provided with a first node net1 for outputting the first signal Sn+, a second node net2 for outputting the second signal Sp+, a third node net3 for outputting the third signal Sn−, and a fourth node net4 for outputting the fourth signal Sp−, and configured to receive the data signal DQ, the first reference signal VR+, and the second reference signal VR−; a first N-channel metal oxide semiconductor (NMOS) MN1 transistor and a second NMOS transistor MN2, the first NMOS transistor MN1 being provided with one terminal connected to the first node net1 and another terminal connected to one terminal of the second NMOS transistor MN2, another terminal of the second NMOS transistor MN2 being connected to the second node net2, a gate of one of the first NMOS transistor MN1 and the second NMOS transistor MN2 being configured to receive a first complementary feedback signal fbpN, a gate of the other one of the first NMOS transistor MN1 and the second NMOS transistor MN2 being configured to receive the enable signalEnDfe, and a level of the first complementary feedback signal fbpN being opposite to a level of the first feedback signal fbp; and a third NMOS transistor MN3 and a fourth NMOS transistor MN4, the third NMOS transistor MN3 being provided with one terminal connected to the third node net3 and another terminal connected to one terminal of the fourth NMOS transistor MN4, another terminal of the fourth NMOS transistor MN4 being connected to the fourth node net4, a gate of one of the third NMOS transistor MN3 and the fourth NMOS transistor MN4 being configured to receive a second complementary feedback signal fbnN, a gate of the other one of the third NMOS transistor MN3 and the fourth NMOS transistor MN4 being configured to receive the enable signal EnDfe, and a level of the second complementary feedback signal fbnN being opposite to a level of the second feedback signal fbn; and a second amplification module 102 configured to receive output signals of the first amplification module 101 as an input signal pair, perform amplification processing on a voltage difference of the input signal pair, and output a first output signal Vout and a second output signal VoutN as a result of the amplification processing.

It should be noted that, that the enable signal EnDfe is at the first level means that the first amplification module 101 determines that the enable signal EnDfe is a level range of logic level 1, namely a high level; and that the enable signal EnDfe is at the second level means that the first amplification module 101 determines that the enable signal EnDfe is a level range of logic level 0, namely a low level. In addition, the level of the first feedback signal fbp being opposite to the level of the second feedback signal fbn means that when one of the first feedback signal fbp and the second feedback signal fbn is at a high level, the other one is at a low level. The level of the first complementary feedback signal fbpN being opposite to the level of the first feedback signal fbp means that when one of the first complementary feedback signal fbpN and the first feedback signal fbp is at a high level, the other one is at a low level. The level of the second complementary feedback signal fbnN being opposite to the level of the second feedback signal fbn means that when one of the second complementary feedback signal fbnN and the second feedback signal fbn is at a high level, the other one is at a low level. Thus, the level of the first complementary feedback signal fbpN is opposite to the level of the second complementary feedback signal fbnN.

Thus, when the influence of the intersymbol interference on the circuit for receiving data 100 needs to be reduced, when the enable signal EnDfe is at the first level, that is, when the enable signal EnDfe is at a logic level 1, one of the first NMOS transistor MN1 and the second NMOS transistor MN2 and one of the third NMOS transistor MN3 and the fourth NMOS transistor MN4 are turned on based on the enable signal EnDfe, the other one of the first NMOS transistor MN1 and the second NMOS transistor MN2 is turned on or off in response to the first complementary feedback signal fbpN, and the other one of the third NMOS transistor MN3 and the fourth NMOS transistor MN4 is turned on or off in response to the second complementary feedback signal fbnN. Since when one of the first complementary feedback signal fbpN and the second complementary feedback signal fbnN is at a high level, and the other one is at a low level, the other one of the first NMOS transistor MN1 and the second NMOS transistor MN2 or the other one of the third NMOS transistor MN3 and the fourth NMOS transistor MN4 is turned on, and the other ones are turned off, such that the first amplification module 101 may selectively perform the first comparison or the second comparison in response to the sampling clock signal clkN, one of the outputted first signal pair and second signal pair is valid, and the other one is invalid, thereby reducing the influence of the intersymbol interference of the received data signal on the circuit for receiving data 100. Moreover, in the first amplification module 101, only one of the circuit for the first comparison and the circuit for the second comparison is in the operating state, and the other one is in the non-operating state, thereby facilitating reducing the power consumption of the circuit for receiving data 100. It should be noted that, on the basis of the enable signal EnDfe, the first feedback signal fbp, and the second feedback signal fbn at this time, the first NMOS transistor MN1 and the second NMOS transistor MN2 turn on a connection path between the first node net1 and the second node net2, or the third NMOS transistor MN3 and the fourth NMOS transistor MN4 turn on a connection path between the third node net3 and the fourth node net4, where the two nodes of the turned-on path cannot output the valid signal pair, such that the amplification unit 131 selectively performs the first comparison or the second comparison.

Moreover, the turn-on resistance of an NMOS transistor is far less than that of a PMOS transistor under the same condition, such that compared with the PMOS transistor, the first NMOS transistor MN1, the second NMOS transistor MN2, the third NMOS transistor MN3, and the fourth NMOS transistor MN4 in the first amplification module 101 are turned on or off more quickly in response to signals respectively received by the gates thereof, and it is easier to make the first amplification module 101 only perform one of the first comparison and the second comparison at the same time, thereby improving the processing effect and processing speed of the first amplification module 101 to the data signal DQ. Thus, it is beneficial to accelerate the processing speed of the circuit for receiving data 100 to the data signal DQ while improving the receiving performance of the circuit for receiving data 100.

It can be understood that, when the enable signal EnDfe is at the first level, the first amplification module 101 selectively performs the first comparison or the second comparison, such that the first amplification module 101 outputs the valid first signal pair or the valid second signal pair, and the other one is the inactive signal pair at this time. It should be noted that, the valid first signal pair means that the level of the first signal Sn+ and the level of the second signal Sp+ in the first signal pair have a great difference; and the valid second signal pair means that the level of the third signal Sn− and the level of the fourth signal Sp− in the second signal pair have a great difference. In this way, it is ensured that the second amplification module 102 receives the pair of differential signals having a great level difference, thereby reducing the influence of the intersymbol interference of the received data signal DQ on the circuit for receiving data 100.

In addition, when the influence of the intersymbol interference on the circuit for receiving data 100 does not need to be considered, when the enable signal EnDfe is at the second level, that is, when the enable signal EnDfe is at a logic level 0, on the basis of the enable signal EnDfe at this time, one of the first NMOS transistor MN1 and the second NMOS transistor MN2 is turned off, the connection path between the first node net1 and the second node net2 is turned off, one of the third node net3 and the fourth node net4 is turned off, the connection path between the third node net3 and the fourth node net4 is turned off, and the amplification unit 131 only performs the first comparison through the control itself. In addition, the first NMOS transistor MN1, the second NMOS transistor MN2, the third NMOS transistor MN3, and the fourth NMOS transistor MN4 are all integrated in the first amplification module 101, facilitating further reducing the overall layout area of the circuit for receiving data 100.

It should be noted that, the case where the intersymbol interference needs to be considered is generally the case where the data signal DQ received by the circuit for receiving data 100 is high-speed data, namely the case where the data transmission rate is very fast; and the case where the intersymbol interference does not need to be considered is the case where the data signal DQ received by the circuit for receiving data 100 is generally low-speed data, namely the case where the data transmission rate is relatively slow.

In some embodiments, the level of the first reference signal VR+ is different from that of the second reference signal VR−, and then, for the data signal DQ having a different level, the data signal DQ may have a great level difference with one of the first reference signal VR+ and the second reference signal VR−. If the first amplification module 101 may perform the first comparison and the second comparison at the same time, the first amplification module 101 can output a group of signal pairs having a greater level difference. In one embodiment of the present disclosure, when there is an intersymbol interference phenomenon in the data signal DQ received by the circuit for receiving data 100, the first amplification module 101 may selectively perform the first comparison or the second comparison on the basis of the first feedback signal fbp and the second feedback signal fbn, one of the outputted first signal pair and second signal pair is valid, and the other one is invalid. The valid group of signal pairs refers to the group of signal pairs having a greater level difference if the first comparison and the second comparison may be performed at the same time, thereby reducing the influence of the intersymbol interference of the received data signal DQ on the circuit for receiving data 100. It can be understood that, when the enable signal EnDfe is at the first level, the first amplification module 101 may selectively perform, on the basis of the received first feedback signal fbp and second feedback signal fbn, a comparison which better processes the data signal DQ, i.e., selectively performing the first comparison or the second comparison to obtain a better group of signal pairs. In this way, when the enable signal EnDfe is at the first level, the first amplification module 101 only performs the better one of the first comparison and the second comparison, and the other one is in the non-operating state, thereby facilitating reducing the power consumption of the circuit for receiving data.

In addition, when the enable signal EnDfe is at the second level, no matter how the level of the first feedback signal fbp and the second feedback signal fbn obtained on the basis of the previously received data changes, the first amplification module 101 regularly performs the first comparison on the basis of the current enable signal EnDfe. That is, at this time, the first amplification module 101 regularly outputs the valid first signal pair and cannot perform the second comparison. That is, the circuit for outputting the second signal pair in the first amplification module 101 may be in the non-operating state, thereby facilitating further reducing the power consumption of the circuit for receiving data.

How the circuit for receiving data 100 reduces the influence of the intersymbol interference of the received data signal DQ on the circuit for receiving data 100 will be described in detail below with reference to a specific example.

In some embodiments, the level of the first reference signal VR+ is higher than that of the second reference signal VR−. If the data signal DQ is at a low level, and there is an intersymbol interference phenomenon in the data signal DQ received by the circuit for receiving data 100, when the enable signal EnDfe is at the first level, the first amplification module 101 performs the first comparison on the basis of the enable signal EnDfe, the first feedback signal fbp, and the second feedback signal fbn at this time, that is, the valid first signal pair is outputted. At this time, the level difference between the data signal DQ and the first reference signal VR+ is greater than that between the data signal DQ and the second reference signal VR−, then performing the first comparison will generate an output signal pair having a greater level difference than performing the second comparison at this time. Therefore, the second amplification module 102 receives the valid first signal pair, thereby improving the accuracy of the outputted first output signal Vout and second output signal VoutN, and facilitating reducing the influence of the intersymbol interference of the received data signal DQ on the circuit for receiving data 100.

In addition, if the data signal DQ is at a high level, and there is an intersymbol interference phenomenon in the data signal DQ received by the circuit for receiving data 100, when the enable signal EnDfe is at the first level, the first amplification module 101 performs the second comparison on the basis of the enable signal EnDfe, the first feedback signal fbp, and the second feedback signal fbn at this time, that is, the valid second signal pair is outputted. At this time, the level difference between the data signal DQ and the first reference signal VR+ is less than that between the data signal DQ and the second reference signal VR−, then performing the second comparison will generate an output signal pair having a greater level difference than performing the first comparison at this time. Therefore, the second amplification module 102 receives the valid second signal pair, thereby improving the accuracy of the outputted first output signal Vout and second output signal VoutN, and facilitating reducing the influence of the intersymbol interference of the received data signal DQ on the circuit for receiving data 100.

It can be understood that, in actual applications, the level of the first reference signal VR+ may also be lower than that of the second reference signal VR−.

It should be noted that, there is an example in FIG. 1, where the gate of the first NMOS transistor MN1 and the gate of the third NMOS transistor MN3 receive the enable signal EnDfe, the gate of the second NMOS transistor MN2 receives the first complementary feedback signal fbpN, and the gate of the fourth NMOS transistor MN4 receives the second complementary feedback signal fbnN. In actual applications, the gate of the first NMOS transistor MN1 may also receive the first complementary feedback signal fbpN, the gate of the third NMOS transistor MN3 may also receive the second complementary feedback signal fbnN, and the gate of the second NMOS transistor MN2 and the gate of the fourth NMOS transistor MN4 may also receive the enable signal EnDfe.

In some embodiments, referring to FIG. 2, on the basis that the first amplification module 101 includes the first NMOS transistor MN1 and the second NMOS transistor MN2, the first amplification module 101 may also include: a fifth NMOS transistor MN5 and a sixth NMOS transistor MN6, the fifth NMOS transistor MN5 being provided with one terminal connected to the first node net1 and another terminal connected to one terminal of the sixth NMOS transistor MN6, another terminal of the sixth NMOS transistor MN6 being connected to the second node net2, a gate of one of the fifth NMOS transistor MN5 and the sixth NMOS transistor MN6 being configured to receive the first complementary feedback signal fbpN, and a gate of the other one of the fifth NMOS transistor MN5 and the sixth NMOS transistor MN6 being configured to receive the enable signal EnDfe.

It can be understood that, a branch constituted by the fifth NMOS transistor MN5 and the sixth NMOS transistor MN6 is connected in parallel to a branch constituted by the first NMOS transistor MN1 and the second NMOS transistor MN2. Thus, when the connection path between the first node net1 and the second node net2 is turned on, it is beneficial to reduce a total channel resistance of the connection path between the first node net1 and the second node net2, thereby accelerating the turn-on speed of the connection path between the first node net1 and the second node net2 in response to the enable signal EnDfe and the first complementary feedback signal fbpN.

In some embodiments, the channel width-length ratio of one of the first NMOS transistor MN1 and the second NMOS transistor MN2 for receiving the enable signal EnDfe is greater than that of the other one, and the channel width-length ratio of one of the fifth NMOS transistor MN5 and the sixth NMOS transistor MN6 for receiving the enable signal EnDfe is greater than that of the other one.

It can be understood that, when the level of the signal received by the gate of an NMOS transistor changes frequently, the channel width of the NMOS transistor is greater, the gate resistance of the NMOS transistor is greater, and in turn, the sensitivity of the gate sensing the change of the level of the signal is reduced. Therefore, for the NMOS transistor in which the level received by the gate frequently changes, the channel width of the NMOS transistor is reduced, facilitating reducing the influence of the gate resistance on the NMOS transistor. Thus, when the enable signal EnDfe is at the first level, the level of the enable signal EnDfe is fixed. For the first NMOS transistor MN1, the second NMOS transistor MN2, the fifth NMOS transistor MN5, and the sixth NMOS transistor MN6, in the two NMOS transistors for receiving the enable signal EnDfe, the gate resistance slightly influences the circuit for receiving data 100. At this time, the level of the first complementary feedback signal fbpN always changes frequently, such that the two NMOS transistors for receiving the first complementary feedback signal fbpN have a smaller channel width, thereby facilitating reducing the influence of the gate resistance on the NMOS transistors.

In addition, the greater the channel width-length ratio of the NMOS transistor, the smaller the turn-on resistance thereof, and the faster the turn-on or turn-off switching speed thereof. On the premise of ensuring that the two NMOS transistors for receiving the first complementary feedback signal fbpN have a smaller channel width, the two NMOS transistors for receiving the enable signal EnDfe have a greater channel width-length ratio, thereby facilitating reducing the total turn-on resistance of the connection path between the first node net1 and the second node net2.

Therefore, two factors of the gate capacitance and the turn-on resistance in the NMOS transistor are comprehensively considered, and when the enable signal EnDfe is at the first level, the two NMOS transistors for receiving the first complementary feedback signal fbpN can sensitively sense the change of the level of the first complementary feedback signal fbpN, and the turn-on or turn-off speed of the connection path between the first node net1 and the second node net2 is accelerated.

In one example, still referring to FIG. 2, the gate of the first NMOS transistor MN1 receives the enable signal EnDfe, and the gate of the second NMOS transistor MN2 receives the first complementary feedback signal fbpN. The channel width of the first NMOS transistor MN1 is greater than that of the second NMOS transistor MN2, such that the channel width-length ratio of the first NMOS transistor MN1 for receiving the enable signal EnDfe is greater than that of the second NMOS transistor MN2 for receiving the first complementary feedback signal fbpN. Moreover, the gate of the fifth NMOS transistor MN5 receives the first complementary feedback signal fbpN, the gate of the sixth NMOS transistor MN6 receives the enable signal EnDfe, and the channel width of the fifth NMOS transistor MN5 is smaller than that of the sixth NMOS transistor MN6, such that the channel width-length ratio of the sixth NMOS transistor MN6 for receiving the enable signal EnDfe is greater than that of the fifth NMOS transistor MN5 for receiving the first complementary feedback signal fbpN.

It should be noted that, there is an example in FIG. 2, where the gate of the first NMOS transistor MN1 and the gate of the sixth NMOS transistor MN6 receive the enable signal EnDfe, and the gate of the second NMOS transistor MN2 and the gate of the fifth NMOS transistor MN5 receive the first complementary feedback signal fbpN. In actual applications, the gate of the first NMOS transistor MN1 and the gate of the sixth NMOS transistor MN6 may also receive the first complementary feedback signal fbpN, and the gate of the second NMOS transistor MN2 and the gate of the fifth NMOS transistor MN5 may also receive the enable signal EnDfe.

In some embodiments, the channel width of the fifth NMOS transistor MN5 is equal to the channel width of the second NMOS transistor MN2; the channel width of the sixth NMOS transistor MN6 is equal to the channel width of the first NMOS transistor MN1; and a channel length of the first NMOS transistor MN1, a channel length of the second NMOS transistor MN2, a channel length of the fifth NMOS transistor MN5, and a channel length of the sixth NMOS transistor MN6 are all equal. Thus, the total equivalent capacitance of the first NMOS transistor MN1 and the fifth NMOS transistor MN5 at the first node net1 is not different from that of the second NMOS transistor MN2 and the sixth NMOS transistor MN6 at the second node net2, such that a load at the first node net1 is consistent with a load at the second node net2.

In some embodiments, referring to FIG. 2, on the basis that the first amplification module 101 includes the third NMOS transistor MN3 and the fourth NMOS transistor MN4, the first amplification module 101 may also include: a seventh NMOS transistor MN7 and an eighth NMOS transistor MN8, the seventh NMOS transistor MN7 being provided with one terminal connected to the third node net3 and another terminal connected to one terminal of the eighth NMOS transistor MN8, another terminal of the eighth NMOS transistor MN8 being connected to the fourth node net4, a gate of one of the seventh NMOS transistor MN7 and the eighth NMOS transistor MN8 being configured to receive the second complementary feedback signal fbnN, and a gate of the other one of the seventh NMOS transistor MN7 and the eighth NMOS transistor MN8 being configured to receive the enable signal EnDfe.

It can be understood that, a branch constituted by the seventh NMOS transistor MN7 and the eighth NMOS transistor MN8 is connected in parallel to a branch constituted by the third NMOS transistor MN3 and the fourth NMOS transistor MN4. Thus, when the connection path between the third node net3 and the fourth node net4 is turned on, it is beneficial to reduce a total channel resistance of the connection path between the third node net3 and the fourth node net4, thereby accelerating the turn-on speed of the connection path between the third node net3 and the fourth node net4 in response to the enable signal EnDfe and the second complementary feedback signal fbnN.

In some embodiments, the channel width-length ratio of one of the third NMOS transistor MN3 and the fourth NMOS transistor MN4 for receiving the enable signal EnDfe is greater than that of the other one, and the channel width-length ratio of one of the seventh NMOS transistor MN7 and the eighth NMOS transistor MN8 for receiving the enable signal EnDfe is greater than that of the other one.

In view of the above description, when the level of the signal received by the gate of an NMOS transistor changes frequently, the channel width of the NMOS transistor is greater, the gate resistance of the NMOS transistor is greater, and in turn, the sensitivity of the gate sensing the change of the level of the signal is reduced. Therefore, for the NMOS transistor in which the level received by the gate frequently changes, the channel width of the NMOS transistor is reduced, facilitating reducing the influence of the gate resistance on the NMOS transistor. Thus, when the enable signal EnDfe is at the first level, the level of the enable signal EnDfe is fixed. For the third NMOS transistor MN3, the fourth NMOS transistor MN4, the seventh NMOS transistor MN7, and the eighth NMOS transistor MN8, in the two NMOS transistors for receiving the enable signal EnDfe, the gate resistance slightly influences the circuit for receiving data 100. At this time, the level of the second complementary feedback signal fbnN always changes frequently, such that the two NMOS transistors for receiving the second complementary feedback signal fbnN have a smaller channel width, thereby facilitating reducing the influence of the gate resistance on the NMOS transistors.

In addition, the greater the channel width-length ratio of the NMOS transistor, the smaller the turn-on resistance thereof, and the faster the turn-on or turn-off switching speed thereof. On the premise of ensuring that the two NMOS transistors for receiving the second complementary feedback signal fbnN have a smaller channel width, the two NMOS transistors for receiving the enable signal EnDfe have a greater channel width-length ratio, thereby facilitating reducing the total turn-on resistance of the connection path between the third node net3 and the fourth node net4. Therefore, two factors of the gate capacitance and the turn-on resistance in the NMOS transistor are comprehensively considered, and when the enable signal EnDfe is at the first level, the two NMOS transistors for receiving the second complementary feedback signal fbnN can sensitively sense the change of the level of the second complementary feedback signal fbnN, and the turn-on or turn-off speed of the connection path between the third node net3 and the fourth node net4 is accelerated.

It can be understood that, the channel width-length ratio of one of the first NMOS transistor MN1 and the second NMOS transistor MN2 for receiving the enable signal EnDfe is greater than that of the other one, the channel width-length ratio of one of the fifth NMOS transistor MN5 and the sixth NMOS transistor MN6 for receiving the enable signal EnDfe is greater than that of the other one, the channel width-length ratio of one of the third NMOS transistor MN3 and the fourth NMOS transistor MN4 for receiving the enable signal EnDfe is greater than that of the other one, and the channel width-length ratio of one of the seventh NMOS transistor MN7 and the eighth NMOS transistor MN8 for receiving the enable signal EnDfe is greater than that of the other one. Thus, the turn-on or turn-off speed of the connection path between the third node net3 and the fourth node net4 is accelerated while accelerating the turn-on or turn-off speed of the connection path between the first node net1 and the second node net2, such that when one of the connection path between the first node net1 and the second node net2 and the connection path between the third node net3 and the fourth node net4 is quickly turned on, the other one is quickly turned off, to prevent the first amplification module 101 from performing the first comparison and the second comparison at the same time.

In one example, still referring to FIG. 2, the gate of the third NMOS transistor MN3 receives the enable signal EnDfe, and the gate of the fourth NMOS transistor MN4 receives the second complementary feedback signal fbnN. In practical applications, the channel width of the third NMOS transistor MN3 is greater than that of the fourth NMOS transistor MN4, such that the channel width-length ratio of the third NMOS transistor MN3 for receiving the enable signal EnDfe is greater than that of the fourth NMOS transistor MN4 for receiving the second complementary feedback signal fbnN. Moreover, the gate of the seventh NMOS transistor MN7 receives the second complementary feedback signal fbnN, the gate of the eighth NMOS transistor MN8 receives the enable signal EnDfe, and the channel width of the seventh NMOS transistor MN7 is smaller than that of the eighth NMOS transistor MN8, such that the channel width-length ratio of the eighth NMOS transistor MN8 for receiving the enable signal EnDfe is greater than that of the seventh NMOS transistor MN7 for receiving the second complementary feedback signal fbnN.

It should be noted that, there is an example in FIG. 2, where the gate of the third NMOS transistor MN3 and the gate of the eighth NMOS transistor MN8 receive the enable signal EnDfe, and the gate of the fourth NMOS transistor MN4 and the gate of the seventh NMOS transistor MN7 receive the second complementary feedback signal fbnN. In practical applications, the gate of the third NMOS transistor MN3 and the gate of the eighth NMOS transistor MN8 may also receive the second complementary feedback signal fbnN, and the gate of the fourth NMOS transistor MN4 and the gate of the seventh NMOS transistor MN7 may also receive the enable signal EnDfe.

In some embodiments, the channel width of the seventh NMOS transistor MN7 is equal to the channel width of the fourth NMOS transistor MN4; the channel width of the eighth NMOS transistor MN8 is equal to the channel width of the third NMOS transistor MN3; and a channel length of the third NMOS transistor MN3, a channel length of the fourth NMOS transistor MN4, a channel length of the seventh NMOS transistor MN7, and a channel length of the eighth NMOS transistor MN8 are all equal. Thus, the total equivalent capacitance of the third NMOS transistor MN3 and the seventh NMOS transistor MN7 at the third node net3 is not different from that of the fourth NMOS transistor MN4 and the eighth NMOS transistor MN8 at the fourth node net4, such that a load at the third node net3 is consistent with a load at the fourth node net4.

It can be understood that, taking FIG. 2 as an example, the channel width-length ratio of the first NMOS transistor MN1 and the sixth NMOS transistor MN6 for receiving the enable signal EnDfe is greater than that of the second NMOS transistor MN2 and the fifth NMOS transistor MN5 for receiving the first complementary feedback signal fbpN, and the channel width-length ratio of the third NMOS transistor MN3 and the eighth NMOS transistor MN8 for receiving the enable signal EnDfe is greater than that of the fourth NMOS transistor MN4 and the seventh NMOS transistor MN7 for receiving the second complementary feedback signal fbnN. Thus, when the enable signal EnDfe is at the first level, the first NMOS transistor MN1, the sixth NMOS transistor MN6, the third NMOS transistor MN3, and the eighth NMOS transistor MN8 are all turned on based on the enable signal EnDfe, the second NMOS transistor MN2 and the fifth NMOS transistor MN5 can sensitively sense the change of the level of the first complementary feedback signal fbpN, and the fourth NMOS transistor MN4 and the seventh NMOS transistor MN7 can sensitively sense the change of the level of the second complementary feedback signal fbnN. When the second NMOS transistor MN2 and the fifth NMOS transistor MN5 are quickly turned on based on the first complementary feedback signal fbpN, the fourth NMOS transistor MN4 and the seventh NMOS transistor MN7 are quickly turned off based on the second complementary feedback signal fbnN; or, when the second NMOS transistor MN2 and the fifth NMOS transistor MN5 are quickly turned off based on the first complementary feedback signal fbpN, the fourth NMOS transistor MN4 and the seventh NMOS transistor MN7 are quickly turned on based on the second complementary feedback signal fbnN. In this way, when the enable signal EnDfe is at the first level, it is beneficial to ensure that the first amplification module 101 only performs one of the first comparison and the second comparison.

It should be noted that the subsequent descriptions are all based on the example illustrated in FIG. 2.

In some embodiments, referring to FIG. 3 and FIG. 4, the sampling clock signal clkN includes a first sampling clock signal clkN1 and a second sampling clock signal clkN2. The amplification unit 131 includes: a first comparison circuit 111 provided with the first node net1 and the second node net2, and configured to receive the data signal DQ and the first reference signal VR+ and perform the first comparison in response to the first sampling clock signal clkN1; a clock generation circuit 151 configured to receive the enable signal EnDfe and an original sampling clock signal clk and output the second sampling clock signal clkN2, where when the enable signal EnDfe is at the first level, a phase of the second sampling clock signal clkN2 is opposite to a phase of the original sampling clock signal clk, and when the enable signal EnDfe is at the second level, the second sampling clock signal clkN2 is a logic high-level signal; and a second comparison circuit 121 provided with the third node net3 and the fourth node net4, and configured to: receive the data signal DQ and the second reference signal VR−; when the enable signal EnDfe is at the first level, perform the second comparison in response to the second sampling clock signal clkN2; and when the enable signal EnDfe is at the second level, turn on a connection path between the third node net3 and a ground terminal, and turn on a connection path between the fourth node net4 and a ground terminal.

It can be understood that, when the enable signal EnDfe is at the first level, when the second NMOS transistor MN2 and the fifth NMOS transistor MN5 turn off the connection path between the first node net1 and the second node net2 in response to the first complementary feedback signal fbpN, the first comparison circuit 111 may perform the first comparison in response to the first sampling clock signal clkN1; and when the enable signal EnDfe is at the second level, when the first NMOS transistor MN1 and the sixth NMOS transistor MN6 turn off the connection path between the first node net1 and the second node net2 in response to the enable signal EnDfe at this time, the first comparison circuit 111 may also perform the first comparison in response to the first sampling clock signal clkN1. Hence, no matter when the enable signal EnDfe is at the first level or when the enable signal EnDfe is at the second level, that is, regardless of whether the influence of the intersymbol interference on the circuit for receiving data 100 needs to be considered, the first comparison circuit 111 may perform the first comparison in response to the first sampling clock signal clkN1. However, only when the enable signal EnDfe is at the first level, when the fourth NMOS transistor MN4 and the seventh NMOS transistor MN7 turn off the connection path between the third node net3 and the fourth node net4 in response to the second complementary feedback signal fbnN, the second comparison circuit 121 may perform the second comparison in response to the second sampling clock signal clkN2 having a variable level. When the enable signal EnDfe is at the second level, the second sampling clock signal clkN2 is a logic high-level signal, the second comparison circuit 121 turns on the connection path between the third node net3 and the ground terminal and the connection path between the fourth node net4 and the ground terminal, and the level of the third signal Sn− outputted by the third node net3 and the level of the fourth signal Sp− outputted by the fourth node net4 are both pulled down to 0, that is, the second comparison circuit 121 does not perform the second comparison and cannot output the valid second signal pair.

In some embodiments, the phase of the first sampling clock signal clkN1 is opposite to the phase of the original sampling clock signal clk. When the enable signal EnDfe is at the first level, the phase of the second sampling clock signal clkN2 is opposite to the phase of the original sampling clock signal clk, and the phase of the first sampling clock signal clkN1 is synchronous with the current phase of the second sampling clock signal clkN2, such that at this time, the first comparison circuit 111 may perform the first comparison in response to the first sampling clock signal clkN1, or the second comparison circuit 121 may perform the second comparison in response to the second sampling clock signal clkN2. Meanwhile, on the basis of the enable signal EnDfe, the first complementary feedback signal fbpN, and the second complementary feedback signal fbnN, the first NMOS transistor MN1, the second NMOS transistor MN2, the fifth NMOS transistor MN5, and the sixth NMOS transistor MN6 further control potentials at the first node net1 and the second node net2, and the third NMOS transistor MN3, the fourth NMOS transistor MN4, the seventh NMOS transistor MN7, and the eighth NMOS transistor MN8 further control potentials at the third node net3 and the fourth node net4. For example, the potential at the first node net1 is the same as the potential at the second node net2, such that the amplification unit 131 actually does not perform the first comparison and cannot output the valid first signal pair; or, the potential at the third node net3 is the same as the potential at the fourth node net4, such that the amplification unit 131 actually does not perform the second comparison and cannot output the valid second signal pair.

Thus, the amplification unit 131 selectively performs the first comparison or the second comparison.

In some embodiments, still referring to FIG. 3 and FIG. 4, the first comparison circuit 111 may include: a first current source 1111 connected between a power supply node Vcc (referring to FIG. 5) and a fifth node net5 and configured to provide a current to the fifth node net5 in response to the first sampling clock signal clkN1; a first comparison unit 1112 connected to the first node net1, the second node net2, and the fifth node net5, and configured to receive the data signal DQ and the first reference signal VR+, perform the first comparison when the first current source 1111 provides a current to the fifth node net5, and output the first signal Sn+ and the second signal Sp+; and a first reset unit 1113 connected to the first node net1 and the second node net2 and configured to reset the first node net1 and the second node net2 in response to the first sampling clock signal clkN1.

The second comparison circuit 121 may include: a second current source 1211 connected between a power supply node Vcc and a sixth node net6 and configured to provide a current to the sixth node net6 in response to the second sampling clock signal clkN2; a second comparison unit 1212 connected to the third node net3, the fourth node net4, and the sixth node net6, and configured to receive the data signal DQ and the second reference signal VR−, perform the second comparison when the second current source 1211 provides a current to the sixth node net6, and output the third signal Sn− and the fourth signal Sp−; and a second reset unit 1213 connected between the third node net3 and the fourth node net4 and configured to reset the third node net3 and the fourth node net4 in response to the second sampling clock signal clkN2.

It can be understood that, the first comparison unit 1112 may control a difference between the current provided to the first node net1 and the current provided to the second node net2 on the basis of a voltage difference between the data signal DQ and the first reference signal VR+, to output the first signal Sn+ and the second signal Sp+. The second comparison unit 1212 may control a difference between the current provided to the third node net3 and the current provided to the fourth node net4 on the basis of a voltage difference between the data signal DQ and the second reference signal VR−, to output the third signal Sn− and the fourth signal Sp−. In addition, after the circuit for receiving data 100 completes the reception of the data signal DQ, the first reference signal VR+, and the second reference signal VR− and the output of the first output signal Vout and the second output signal VoutN, the first reset unit 1113 may reset the level at the first node net1 and the level at the second node net2 to an original value, and the second reset unit 1213 may reset the level at the third node net3 and the level at the fourth node net4 to an original value, such that the circuit for receiving data 100 subsequently performs next data reception and processing.

In some embodiments, a circuit structure of the first current source 1111 is the same as that of the second current source 1211; and a circuit structure of the first comparison unit 1112 is the same as that of the second comparison unit 1212. Thus, the first signal pair outputted by the first comparison circuit 111 is mainly influenced by the first reference signal VR+, or the second signal pair outputted by the second comparison circuit 121 is mainly influenced by the second reference signal VR−, such that the circuit for receiving data 100 may further reduce, on the basis of the first reference signal VR+ and the second reference signal VR−, the influence of the intersymbol interference of the received data signal DQ on the circuit for receiving data 100, thereby further improving the accuracy of the first output signal Vout and the second output signal VoutN outputted by the second amplification module 102.

In some embodiments, referring to FIG. 5 and FIG. 6, the first current source 1111 may include: a first PMOS transistor MP1 connected between the power supply node Vcc and the fifth node net5 and provided with a gate for receiving the first sampling clock signal clkN1. The second current source 1211 may include: a second PMOS transistor MP2 connected between the power supply node Vcc and the sixth node net6 and provided with a gate for receiving the second sampling clock signal clkN2.

Thus, when the first sampling clock signal clkN1 is at a low level, the gate of the first PMOS transistor MP1 is turned on by receiving the first sampling clock signal clkN1, to provide the current to the fifth node net5, such that the first comparison unit 1112 is in an operating state. That is, the first comparison is performed on the received data signal DQ and first reference signal VR+. Meanwhile, the enable signal EnDfe is at a high level, the first complementary feedback signal fbpN is at a low level, the second NMOS transistor MN2 and the fifth NMOS transistor MN5 are both turned off, and the connection path between the first node net1 and the second node net2 is turned off. When the second sampling clock signal clkN2 is at a low level, the gate of the second PMOS transistor MP2 is turned on by receiving the second sampling clock signal clkN2, to provide the current to the sixth node net6, such that the second comparison unit 1212 is in an operating state, and the second comparison is performed on the received data signal DQ and second reference signal VR−. Meanwhile, the enable signal EnDfe is at a high level, the second complementary feedback signal fbnN is at a low level, the fourth NMOS transistor MN4 and the seventh NMOS transistor MN7 are both turned off, and the connection path between the third node net3 and the fourth node net4 is turned off.

In one example, the phase of the first sampling clock signal clkN1 is opposite to the phase of the original sampling clock signal clk. When the influence of the intersymbol interference on the circuit for receiving data 100 needs to be reduced, when the enable signal EnDfe is at the first level, namely high level, the phase of the second sampling clock signal clkN2 is also opposite to the phase of the original sampling clock signal clk, and at this time, the phase of the first sampling clock signal clkN1 is synchronous with the phase of the second sampling clock signal clkN2, such that the first current source 1111 may provide the current to the fifth node net5 for the preparation of the first comparison unit 1112 performing the first comparison, and the second current source 1211 may provide the current to the sixth node net6 for the preparation of the second comparison unit 1212 performing the second comparison. At this time, the enable signal EnDfe is at a high level. If the first complementary feedback signal fbpN is at a low level, the connection path between the first node net1 and the second node net2 is turned off, and the first comparison unit 1112 performs the first comparison. At this time, the second complementary feedback signal fbnN is at a high level, the connection path between the third node net3 and the fourth node net4 is turned on, and the second comparison unit 1212 cannot perform the second comparison. If the first complementary feedback signal fbpN is at a high level, the connection path between the first node net1 and the second node net2 is turned on, and the first comparison unit 1112 cannot perform the first comparison. At this time, the second complementary feedback signal fbnN is at a low level, the connection path between the third node net3 and the fourth node net4 is turned off, and the second comparison unit 1212 performs the second comparison.

In addition, when the influence of the intersymbol interference on the circuit for receiving data 100 does not need to be considered, when the enable signal EnDfe is at the second level, namely low level, the second sampling clock signal clkN2 is a logic high-level signal, and the second PMOS transistor MP2 is always turned off, such that the current in the second comparison unit 1212 is almost 0, to reduce the power consumption of the circuit for receiving data 100. Moreover, at this time, the second comparison unit 1212 cannot perform the second comparison and cannot output the valid second signal pair. At this time, the first sampling clock signal clkN1 is a clock signal, and the first PMOS transistor MP1 may be turned on in response to the clock signal, such that the first comparison unit 1112 performs the first comparison to output the valid first signal pair, such that the circuit for receiving data 100 may normally operate as a whole.

In some embodiments, still referring to FIG. 5 and FIG. 6, the first comparison unit 1112 may include: a third PMOS transistor MP3 connected between the first node net1 and the fifth node net5 and provided with a gate for receiving the data signal DQ; and a fourth PMOS transistor MP4 connected between the second node net2 and the fifth node net5 and provided with a gate for receiving the first reference signal VR+. The second comparison unit 1212 may include: a fifth PMOS transistor MP5 connected between the third node net3 and the sixth node net6 and provided with a gate for receiving the data signal DQ; and a sixth PMOS transistor MP6 connected between the fourth node net4 and the sixth node net6 and provided with a gate for receiving the second reference signal VR−.

It should be noted that, for the first comparison unit 1112, the level of the data signal DQ and the level of the first reference signal VR+ are changed asynchronously, such that the turn-on moment of the third PMOS transistor MP3 for receiving the data signal DQ is different from the turn-on moment of the fourth PMOS transistor MP4 for receiving the first reference signal VR+; and at the same moment, the turn-on degree of the third PMOS transistor MP3 is different from the turn-on degree of the fourth PMOS transistor MP4. It can be understood that, since the turn-on degree of the third PMOS transistor MP3 is different from the turn-on degree of the fourth PMOS transistor MP4, and the shunt capability of the third PMOS transistor MP3 to the current at the fifth node net5 is also different from the shunt capability of the fourth PMOS transistor MP4 to the current at the fifth node net5, the voltage at the first node net1 is different from the voltage at the second node net2, thereby facilitating outputting the first signal pair in which the first signal Sn+ and the second signal Sp+ have a great signal level difference.

For the second comparison unit 1212, the level of the data signal DQ and the level of the second reference signal VR− are changed asynchronously, such that the turn-on moment of the fifth PMOS transistor MP5 for receiving the data signal DQ is different from the turn-on moment of the sixth PMOS transistor MP6 for receiving the second reference signal VR−; and at the same moment, the turn-on degree of the fifth PMOS transistor MP5 is different from the turn-on degree of the sixth PMOS transistor MP6. It can be understood that, since the turn-on degree of the fifth PMOS transistor MP5 is different from the turn-on degree of the sixth PMOS transistor MP6, and the shunt capability of the fifth PMOS transistor MP5 to the current at the sixth node net6 is also different from the shunt capability of the sixth PMOS transistor MP6 to the current at the sixth node net6, the voltage at the third node net3 is different from the voltage at the fourth node net4, thereby facilitating outputting the second signal pair in which the third signal Sn− and the fourth signal Sp− have a great signal level difference.

In one example, the first amplification module 101 performs the first comparison. When the level of the data signal DQ is lower than the level of the first reference signal VR+, the turn-on degree of the third PMOS transistor MP3 is greater than the turn-on degree of the fourth PMOS transistor MP4, such that more current at the fifth node net5 flows into a channel where the third PMOS transistor MP3 is located, and the current at the first node net1 is greater than the current at the second node net2, thereby further making the level of the first signal Sn+ outputted by the first node net1 high, and making the level of the second signal Sp+ outputted by the second node net2 low. In another example, the first amplification module 101 performs the second comparison. When the level of the data signal DQ is lower than the level of the second reference signal VR−, the turn-on degree of the fifth PMOS transistor MP5 is greater than the turn-on degree of the sixth PMOS transistor MP6, such that more current at the sixth node net6 flows into a channel where the fifth PMOS transistor MP5 is located, and the current at the third node net3 is greater than the current at the fourth node net4, thereby further making the level of the third signal Sn− outputted by the third node net3 high, and making the level of the fourth signal Sp− outputted by the fourth node net4 low.

Similarly, the level of the data signal DQ is higher than the level of the first reference signal VR+, the turn-on degree of the third PMOS transistor MP3 is less than the turn-on degree of the fourth PMOS transistor MP4, the level of the first signal Sn+ outputted by the first node net1 is low, and the level of the second signal Sp+ outputted by the second node net2 is high. When the level of the data signal DQ is higher than the level of the second reference signal VR−, the turn-on degree of the fifth PMOS transistor MP5 is less than the turn-on degree of the sixth PMOS transistor MP6, the level of the third signal Sn− outputted by the third node net3 is low, and the level of the fourth signal Sp− outputted by the fourth node net4 is high.

In some embodiments, still referring to FIG. 5 and FIG. 6, the first reset unit 1113 may include: a ninth NMOS transistor MN9 connected between the first node net1 and a ground terminal and provided with a gate for receiving the first sampling clock signal clkN1; and a tenth NMOS transistor MN10 connected between the second node net2 and the ground terminal and provided with a gate for receiving the first sampling clock signal clkN1. The second reset unit 1213 may include: an eleventh NMOS transistor MN11 connected between the third node net3 and a ground terminal and provided with a gate for receiving the second sampling clock signal clkN2; and a twelfth NMOS transistor MN12 connected between the fourth node net4 and the ground terminal and provided with a gate for receiving the second sampling clock signal clkN2.

In one example, the phase of the first sampling clock signal clkN1 is opposite to the phase of the original sampling clock signal clk. When the influence of the intersymbol interference on the circuit for receiving data needs to be reduced, when the enable signal EnDfe is at the first level, the phase of the second sampling clock signal clkN2 is also opposite to the phase of the original sampling clock signal clk, and at this time, the phase of the first sampling clock signal clkN1 is synchronous with the phase of the second sampling clock signal clkN2. If the first sampling clock signal clkN1 and the second sampling clock signal clkN2 are both at a low level, the first PMOS transistor MP1 and the second PMOS transistor MP2 are both turned on, at this time, the ninth NMOS transistor MN9, the tenth NMOS transistor MN10, the eleventh NMOS transistor MN11, and the twelfth NMOS transistor MN12 are all turned off, and at this time, one of the connection path between the first node net1 and the second node net2 and the connection path between the third node net3 and the fourth node net4 is controlled to be turned on based on the first complementary feedback signal fbpN and the second complementary feedback signal fbnN, such that the first amplification module 101 selectively performs the first comparison or the second comparison. Moreover, the ninth NMOS transistor MN9 and the tenth NMOS transistor MN10 may serve as loads of the first comparison unit 1112 to increase the amplification gain of the first comparison unit 1112. The eleventh NMOS transistor MN11 and the twelfth NMOS transistor MN12 may serve as loads of the second comparison unit 1212 to increase the amplification gain of the second comparison unit 1212.

If the first sampling clock signal clkN1 and the second sampling clock signal clkN2 are both at a high level, the first PMOS transistor MP1 and the second PMOS transistor MP2 are both turned off, and there is no current flowing through the first comparison unit 1112 and the second comparison unit 1212. At this time, the ninth NMOS transistor MN9, the tenth NMOS transistor MN10, the eleventh NMOS transistor MN11, and the twelfth NMOS transistor MN12 are all turned on, and the voltage at the first node net1, the voltage at the second node net2, the voltage at the third node net3, and the voltage at the fourth node net4 are pulled down to reset the first node net1, the second node net2, the third node net3, and the fourth node net4, such that the circuit for receiving data 100 subsequently performs next data reception and processing.

In addition, when the influence of the intersymbol interference on the circuit for receiving data 100 does not need to be considered, when the enable signal EnDfe is at the second level, the second sampling clock signal clkN2 is a logic high-level signal, the second PMOS transistor MP2 is always turned off, at this time, the eleventh NMOS transistor MN11 and the twelfth NMOS transistor MN12 are both turned on, the connection path between the third node net3 and the ground terminal is turned on, and the connection path between the fourth node net4 and the ground terminal is turned on to reset the third node net3 and the fourth node net4. At this time, there is almost 0 current in the second comparison unit 1212, thereby facilitating reducing the power consumption of the circuit for receiving data 100. At this time, if the first sampling clock signal clkN1 is at a low level, the first PMOS transistor MP1 is turned on, and the ninth NMOS transistor MN9 and the tenth NMOS transistor MN10 are both turned off, to ensure that the first comparison circuit 111 performs the first comparison and outputs the valid first signal pair, such that the second amplification module 102 may regularly receive the first signal pair subsequently. Or, if the first sampling clock signal clkN1 is at a high level, the first PMOS transistor MP1 is turned off, and the ninth NMOS transistor MN9 and the tenth NMOS transistor MN10 are both turned on, to pull down the voltage at the first node net1 and the voltage at the second node net2 to reset the first node net1 and the second node net2, such that the circuit for receiving data 100 subsequently performs next data reception and processing.

In some embodiments, still referring to FIG. 5 and FIG. 6, the clock generation circuit 151 may include: a first NAND gate circuit 1511 provided with one input terminal for receiving the original sampling clock signal clk, the other input terminal connected to a power supply node Vcc, and an output terminal for outputting the first sampling clock signal clkN1.

It can be understood that the input terminal of the first NAND gate circuit 1511 connected to the power supply node Vcc receives a high level. At this time, if the original sampling clock signal clk received by the other input end of the first NAND gate circuit 1511 is at a high level, the first sampling clock signal clkN1 is at a low level; and if the original sampling clock signal clk received by the other input end of the first NAND gate circuit 1511 is at a low level, the first sampling clock signal clkN1 is at a high level. Thus, the phase of the first sampling clock signal clkN1 is opposite to the phase of the original sampling clock signal clk. Therefore, when the influence of the intersymbol interference on the circuit for receiving data needs to be reduced, the phase of the first sampling clock signal clkN1 is synchronous with the phase of the second sampling clock signal clkN2, and the first amplification module 101 may selectively perform the first comparison or the second comparison.

In some embodiments, still referring to FIG. 5 and FIG. 6, the clock generation circuit 151 may include: a second NAND gate circuit 1512 provided with one input terminal for receiving the original sampling clock signal clk, the other input terminal for receiving the enable signal EnDfe, and an output terminal for outputting the second sampling clock signal clkN2.

It can be understood that the phase of the first sampling clock signal clkN1 is opposite to the phase of the original sampling clock signal clk. When the influence of the intersymbol interference on the circuit for receiving data 100 needs to be reduced, the enable signal EnDfe is at a high level. If the original sampling clock signal clk is at a high level, the second sampling clock signal clkN2 outputted by the second NAND gate circuit 1512 is at a low level. At this time, the first sampling clock signal clkN1 is also at a low level, the first amplification module 101 selectively performs the better one of the first comparison and the second comparison on the basis of the first complementary feedback signal fbpN and the second complementary feedback signal fbnN, the second amplification module 102 subsequently receives the valid first signal pair or the valid second signal pair, and the other group of signal pairs is invalid, to reduce the influence of the intersymbol interference of the received data signal DQ on the circuit for receiving data 100. If the original sampling clock signal clk is at a low level, the second sampling clock signal clkN2 outputted by the second NAND gate circuit 1512 is at a high level. At this time, the first sampling clock signal clkN1 is also at a high level, and the first comparison unit 1112 and the second comparison unit 1212 are both in a non-operating state. The first reset unit 1113 may reset the level at the first node net1 and the level at the second node net2 to an original value, and the second reset unit 1213 may reset the level at the third node net3 and the level at the fourth node net4 to an original value, such that the circuit for receiving data 100 subsequently performs next data reception and processing.

When the influence of the intersymbol interference on the circuit for receiving data 100 does not need to be considered, the enable signal EnDfe is at a low level. At this time, no matter the original sampling clock signal clk is at a high level or a low level, the second sampling clock signal clkN2 outputted by the second NAND gate circuit 1512 is at a high level. Therefore, no matter the first sampling clock signal clkN1 is at a high level or a low level, that is, no matter the first comparison unit 1112 performs the first comparison, the connection path between the third node net3 and the ground terminal and the connection path between the fourth node net4 and the ground terminal in the second comparison circuit 121 may both be turned on, such that there is almost 0 current in the second comparison circuit 121 at this time, and the second comparison cannot be performed.

In some embodiments, referring to FIG. 4, the second amplification module 102 includes: a first input unit 112 connected to a seventh node net7 and an eighth node net8, and configured to receive the first signal pair for third comparison and provide a signal to the seventh node net7 and a signal to the eighth node net8 respectively as a result of the third comparison; a second input unit 122 connected to the seventh node net7 and the eighth node net8, and configured to receive the second signal pair for fourth comparison and provide a signal to the seventh node net7 and a signal to the eighth node net8 respectively as a result of the fourth comparison; and a latch unit 132 connected to the seventh node net7 and the eighth node net8, and configured to amplify and latch a signal of the seventh node net7 and a signal of the eighth node net8, and output the first output signal Vout and the second output signal VoutN respectively through a first output node net9 and a second output node net10.

It can be understood that, when the influence of the intersymbol interference on the circuit for receiving data needs to be reduced, when the enable signal EnDfe is at the first level, the first amplification module 101 selectively performs the first comparison and the second comparison on the basis of the first complementary feedback signal fbpN and the second complementary feedback signal fbnN, one of the outputted first signal pair and second signal pair is valid, and the other one is invalid. Moreover, at this time, the input unit that may be turned on receives the valid signal pair; and the valid signal pair means that: if the first comparison and the second comparison may be performed at the same time, the group of signal pairs having a greater level difference can be outputted, thereby improving the accuracy of the first output signal Vout and the second output signal VoutN outputted by the second amplification module 102. When the influence of the intersymbol interference on the circuit for receiving data 100 does not need to be considered, when the enable signal EnDfe is at the second level, the first amplification module 101 regularly outputs the valid first signal pair, the first input unit 112 is turned on or off in response to the valid first signal pair, and the signal pair received by the second input unit 122 is invalid such that the second input unit 122 is in an off state, thereby reducing the power consumption of the circuit for receiving data.

The latch unit 132 is configured to output, according to the signal at the seventh node net7 and the signal at the eighth node net8, a high level signal to the first output node net9 and a low level signal to the second output node net10, or output a low level signal to the first output node net9 and a high level signal to the second output node net10.

In some embodiments, referring to FIG. 7 and FIG. 8, the first input unit 112 may include: a thirteenth NMOS transistor MN13 provided with a drain connected to the seventh node net7, a source connected to a ground terminal, and a gate for receiving the first signal Sn+; and a fourteenth NMOS transistor MN14 provided with a drain connected to the eighth node net8, a source connected to a ground terminal, and a gate for receiving the second signal Sp+. The second input unit 122 may include: a fifteenth NMOS transistor MN15 provided with a drain connected to the seventh node net7, a source connected to a ground terminal, and a gate for receiving the third signal Sn−; and a sixteenth NMOS transistor MN16 provided with a drain connected to the eighth node net8, a source connected to a ground terminal, and a gate for receiving the fourth signal Sp−.

In one example, when the first amplification module 101 performs the first comparison, if the level of the data signal DQ is higher than the level of the first reference signal VR+, the level of the first signal Sn+ is low, the level of the second signal Sp+ is high, and the turn-on degree of the fourteenth NMOS transistor MN14 is greater than the turn-on degree of the thirteenth NMOS transistor MN13, such that the voltage at the eighth node net8 is less than the voltage at the seventh node net7. Similarly, if the level of the data signal DQ is lower than the level of the first reference signal VR+, the level of the first signal Sn+ is high, the level of the second signal Sp+ is low, and the turn-on degree of the thirteenth NMOS transistor MN13 is greater than the turn-on degree of the fourteenth NMOS transistor MN14, such that the voltage at the seventh node net7 is less than the voltage at the eighth node net8.

In another example, when the first amplification module 101 performs the second comparison, if the level of the data signal DQ is higher than the level of the second reference signal VR−, the level of the third signal Sn− is low, the level of the fourth signal Sp− is high, and the turn-on degree of the sixteenth NMOS transistor MN16 is greater than the turn-on degree of the fifteenth NMOS transistor MN15, such that the voltage at the eighth node net8 is less than the voltage at the seventh node net7. Similarly, if the level of the data signal DQ is lower than the level of the second reference signal VR−, the level of the third signal Sn− is high, the level of the fourth signal Sp− is low, and the turn-on degree of the fifteenth NMOS transistor MN15 is greater than the turn-on degree of the sixteenth NMOS transistor MN16, such that the voltage at the seventh node net7 is less than the voltage at the eighth node net8.

In some embodiments, still referring to FIG. 7 and FIG. 8, the latch unit 132 may include: a seventeenth NMOS transistor MN17 and a seventh PMOS transistor MP7, a gate of the seventeenth NMOS transistor MN17 and a gate of the seventh PMOS transistor MP7 being both connected to the second output node net10, a source of the seventeenth NMOS transistor MN17 being connected to the seventh node net7, a drain of the seventeenth NMOS transistor MN17 and a drain of the seventh PMOS transistor MP7 being both connected to the first output node net9, and a source of the seventh PMOS transistor MP7 being connected to a power supply node Vcc; and an eighteenth NMOS transistor MN18 and an eighth PMOS transistor MP8, a gate of the eighteenth NMOS transistor MN18 and a gate of the eighth PMOS transistor MP8 being both connected to the first output node net9, a source of the eighteenth NMOS transistor MN18 being connected to the eighth node net8, a drain of the eighteenth NMOS transistor MN18 and a drain of the eighth PMOS transistor MP8 being both connected to the second output node net10, and a source of the eighth PMOS transistor MP8 being connected to the power supply node Vcc.

In one example, when the first amplification module 101 performs the first comparison, if the level of the data signal DQ is higher than the level of the first reference signal VR+, the level of the first signal Sn+ is low, the level of the second signal Sp+ is high, and the voltage at the eighth node net8 is less than the voltage at the seventh node net7, such that the turn-on degree of the eighteenth NMOS transistor MN18 is greater than the turn-on degree of the seventeenth NMOS transistor MN17, the voltage at the second output node net10 is less than the voltage at the first output node net9, and the turn-on degree of the eighth PMOS transistor MP8 is less than the turn-on degree of the seventh PMOS transistor MP7. The latch unit 132 forms positive feedback amplification, further making the first output signal Vout outputted by the first output node net9 at a high level, and making the second output signal VoutN outputted by the second output node net10 at a low level. Similarly, if the level of the data signal DQ is lower than the level of the first reference signal VR+, the voltage at the seventh node net7 is less than the voltage at the eighth node net8, the first output signal Vout outputted by the first output node net9 is at a low level, and the second output signal VoutN outputted by the second output node net10 is at a high level.

In another example, when the first amplification module 101 performs the second comparison, if the level of the data signal DQ is higher than the level of the second reference signal VR−, the level of the third signal Sn− is low, the level of the fourth signal Sp− is high, and the turn-on degree of the sixteenth NMOS transistor MN16 is greater than the turn-on degree of the fifteenth NMOS transistor MN15, such that the voltage at the eighth node net8 is less than the voltage at the seventh node net7, thereby making the first output signal Vout outputted by the first output node net9 at a high level, and making the second output signal VoutN outputted by the second output node net10 at a low level. Similarly, if the level of the data signal DQ is lower than the level of the second reference signal VR−, the level of the third signal Sn− is high, the level of the fourth signal Sp− is low, and at this time, the first output signal Vout outputted by the first output node net9 is at a low level, and the second output signal VoutN outputted by the second output node net10 is at a high level.

In some embodiments, referring to FIG. 4, the second amplification module 102 may further include: a third reset unit 142 connected between the power supply node Vcc and an output terminal of the latch unit 132 and configured to reset the output terminal of the latch unit 132. Thus, after the circuit for receiving data 100 completes the reception of the data signal DQ, the first reference signal VR+, and the second reference signal VR− and the output of the first output signal Vout and the second output signal VoutN, the third reset unit 142 may reset the level at the first output node net9 and the level at the second output node net10 to an original value, such that the circuit for receiving data 100 subsequently performs next data reception and processing.

In some embodiments, referring to FIG. 7 and FIG. 8, the third reset unit 142 may include: a ninth PMOS transistor MP9 connected between the first output node net9 and the power supply node Vcc and provided with a gate for receiving the original sampling clock signal clk; and a tenth PMOS transistor MP10 connected between the second output node net10 and the power supply node Vcc and provided with a gate for receiving the original sampling clock signal clk.

In one example, the phase of the first sampling clock signal clkN1 is opposite to the phase of the original sampling clock signal clk. When the influence of the intersymbol interference on the circuit for receiving data 100 needs to be reduced, the enable signal EnDfe is at a logic level 1, the phase of the second sampling clock signal clkN2 is opposite to the phase of the original sampling clock signal clk. When the original sampling clock signal clk is at a high level, the first sampling clock signal clkN1 and the second sampling clock signal clkN2 are both at a low level, the first PMOS transistor MP1 and the second PMOS transistor MP2 are both turned on, and at this time, the first amplification module 101 selectively performs one of the first comparison and the second comparison on the basis of the first complementary feedback signal fbpN and the second complementary feedback signal fbnN, such that the first amplification module 101 only outputs one of the valid first signal pair and the valid second signal pair. For example, when the first complementary feedback signal fbpN is at a low level, and the second complementary feedback signal fbnN is at a high level, the first comparison unit 1112 performs the first comparison, and the second comparison unit 1212 cannot perform the second comparison. At this time, the ninth NMOS transistor MN9, the tenth NMOS transistor MN10, the eleventh NMOS transistor MN11, the twelfth NMOS transistor MN12, the ninth PMOS transistor MP9, and the tenth PMOS transistor MP10 are all turned off.

When the original sampling clock signal clk is at a low level, the first sampling clock signal clkN1 and the second sampling clock signal clkN2 are both at a high level, and the first PMOS transistor MP1 and the second PMOS transistor MP2 are both turned off. At this time, the ninth NMOS transistor MN9, the tenth NMOS transistor MN10, the eleventh NMOS transistor MN11, and the twelfth NMOS transistor MN12 are all turned on, and the voltage at the first node net1, the voltage at the second node net2, the voltage at the third node net3, and the voltage at the fourth node net4 are pulled down to reset the first node net1, the second node net2, the third node net3, and the fourth node net4. The ninth PMOS transistor MP9 and the tenth PMOS transistor MP10 are also turned on, and the voltage at the first output node net9 and the voltage at the second output node net10 are pulled up to reset the first output node net9 and the second output node net10.

When the influence of the intersymbol interference on the circuit for receiving data 100 does not need to be considered, the enable signal EnDfe is at a logic level 0. At this time, no matter the original sampling clock signal clk is at a high level or a low level, the second sampling clock signal clkN2 is always at a high level, and the second PMOS transistor MP2 is always turned off, to reduce the current in the second comparison circuit 121, thereby reducing the power consumption of the circuit for receiving data 100.

In some embodiments, referring to FIG. 4, the circuit for receiving data 100 may further include: a first inverter circuit 114 configured to receive the first feedback signal fbp and output the first complementary feedback signal fbpN; and a second inverter circuit 124 configured to receive the second feedback signal fbn and output the second complementary feedback signal fbnN. Thus, the first inverter circuit 114 converts the first feedback signal fbp into the first complementary feedback signal fbpN and provides same to the gate of the second NMOS transistor MN2 and the gate of the fifth NMOS transistor MN5, and the second inverter circuit 124 converts the second feedback signal fbn into the second complementary feedback signal fbnN and provides same to the gate of the fourth NMOS transistor MN4 and the gate of the seventh NMOS transistor MN7.

In some embodiments, referring to FIG. 4 to FIG. 6, the first inverter circuit 114 may include a first inverter 1141; and the second inverter circuit 124 includes a second inverter 1241.

Figure 9:
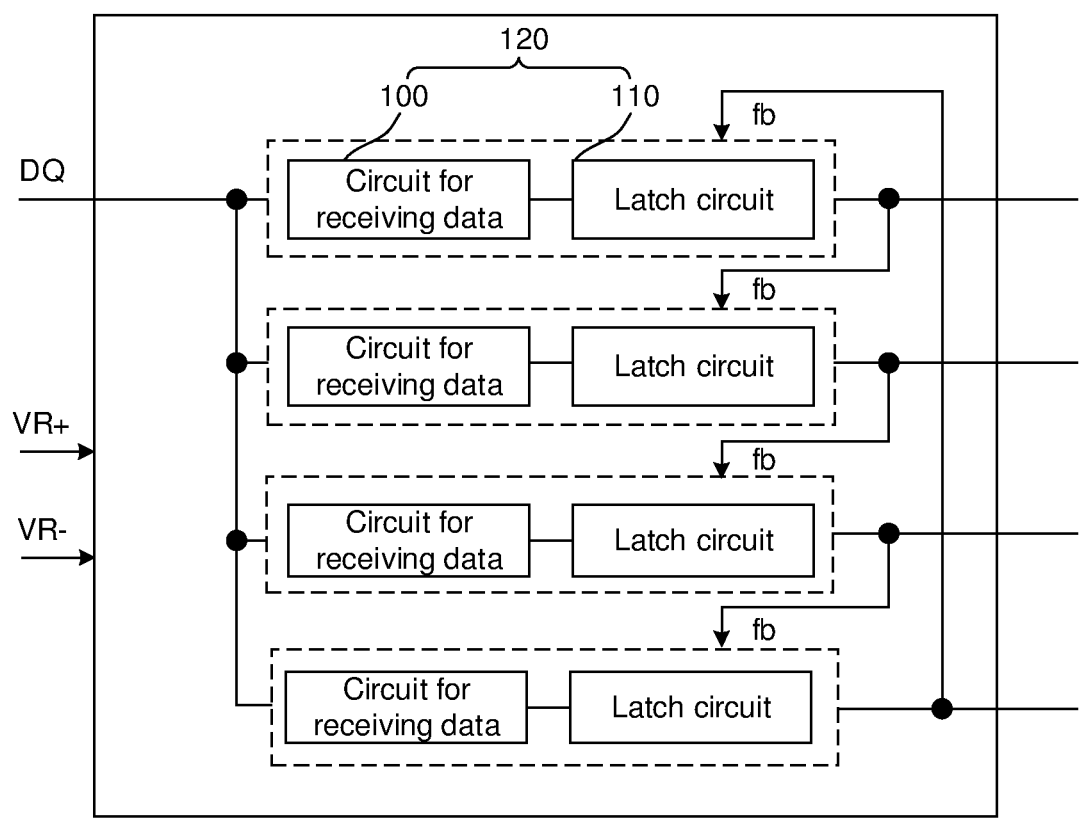
FIG. 9 is a functional block diagram of a system for receiving data according to another embodiment of the present disclosure.

It should be noted that, referring to FIG. 9, the system for receiving data 100 and the latch circuit 110 connected to the circuit for receiving data 100 may constitute a plurality of data transmission circuits 120, and the plurality of cascaded data transmission circuits 120 constitute a system for receiving data; an output signal of a previous stage data transmission circuit 120 is used as the feedback signal fb of a next stage data transmission circuit 120; and an output signal of a last stage data transmission circuit 120 is used as the feedback signal fb of a first stage data transmission circuit 120. The feedback signal fb includes a first feedback signal fbp and a second feedback signal fbn.

It can be understood that, when the plurality of circuits for receiving data 100 are cascaded, the first output signal Vout and the second output signal VoutN outputted by the previous stage circuit for receiving data 100 are respectively used as the first feedback signal fbp and the second feedback signal fbn of the next stage circuit for receiving data 100, and the next stage circuit for receiving data 100 selectively performs the first comparison or the second comparison on the basis of the received first feedback signal fbp and second feedback signal fbn; and the first output signal Vout and the second output signal VoutN outputted by the last stage circuit for receiving data 100 are respectively used as the first feedback signal fbp and the second feedback signal fbn of the first stage circuit for receiving data 100, and the first stage circuit for receiving data 100 selectively performs the first comparison or the second comparison on the basis of the received first feedback signal fbp and second feedback signal fbn.

Specifically, the first output signal Vout outputted by the first output node net9 of the previous stage circuit for receiving data 100 is used as the first feedback signal fbp of the next stage circuit for receiving data 100, and the second output signal VoutN outputted by the second output node net10 of the previous stage circuit for receiving data 100 is used as the second feedback signal fbn of the next stage circuit for receiving data 100. Then, the first inverter 1141 in the next stage circuit for receiving data 100 converts the first feedback signal fbp into the first complementary feedback signal fbpN and provides same to the gate of the second NMOS transistor MN2 and the gate of the fifth NMOS transistor MN5 at this stage, and the second inverter 1241 in the next stage circuit for receiving data 100 converts the second feedback signal fbn into the second complementary feedback signal fbnN and provides same to the gate of the fourth NMOS transistor MN4 and the gate of the seventh NMOS transistor MN7 at this stage.

It can be understood that, if the first output signal Vout outputted by the first output node net9 of the previous stage circuit for receiving data 100 is at a high level, and the second output signal VoutN outputted by the second output node net10 is at a low level, the first feedback signal fbp received by the next stage circuit for receiving data 100 is at a high level, the second feedback signal fbn is at a low level, the first complementary feedback signal fbpN is at a low level, and the second complementary feedback signal fbnN is at a high level.

In some embodiments, referring to FIG. 4 and FIG. 8, the first inverter circuit 114 may include a third NAND gate 1142, and the third NAND gate 1142 is provided with two input terminals for respectively receiving the first feedback signal fbp and the enable signal EnDfe and an output terminal for outputting the first complementary feedback signal fbpN. The second inverter circuit 124 may include a fourth NAND gate 1242, and the fourth NAND gate 1242 is provided with two input terminals for respectively receiving the second feedback signal fbn and the enable signal EnDfe and an output terminal for outputting the second complementary feedback signal fbnN.

When the enable signal EnDfe is at the first level, i.e., logic level 1, the level change of the first feedback signal fbp received by the third NAND gate 1142 is opposite to that of the outputted first complementary feedback signal fbpN, that is, the level of the first complementary feedback signal fbpN is opposite to the level of the first feedback signal fbp. Moreover, the level change of the second feedback signal fbn received by the fourth NAND gate 1242 is opposite to that of the outputted second complementary feedback signal fbnN, that is, the level of the second complementary feedback signal fbnN is opposite to the level of the second feedback signal fbn.

It should be noted that, in one example, referring to FIG. 4 and FIG. 8, when a plurality of circuits for receiving data 100 are cascaded, the first output signal Vout outputted by the first output node net9 of the previous stage circuit for receiving data 100 is used as the first feedback signal fbp, and the third NAND gate 1142 in the previous stage circuit for receiving data 100 receives the first feedback signal fbp and the enable signal EnDfe and outputs the first complementary feedback signal fbpN to the next stage circuit for receiving data 100. The second output signal VoutN outputted by the second output node net10 of the previous stage circuit for receiving data 100 is used as the second feedback signal fbn, and the fourth NAND gate 1242 in the previous stage circuit for receiving data 100 receives the second feedback signal fbn and the enable signal EnDfe and outputs the second complementary feedback signal fbnN to the next stage circuit for receiving data 100. Then, the next stage circuit for receiving data 100 selectively performs the first comparison or the second comparison on the basis of the received first complementary feedback signal fbpN and second complementary feedback signal fbnN. It can be understood that, the first complementary feedback signal fbpN is obtained after being processed by the third NAND gate 1142, thereby enhancing the driving capability of the first complementary feedback signal fbpN using the third NAND gate 1142. The second complementary feedback signal fbnN is obtained after being processed by the fourth NAND gate 1242, thereby enhancing the driving capability of the second complementary feedback signal fbnN using the fourth NAND gate 1242. Thus, when there is a long transmission path for transmitting the first complementary feedback signal fbpN and the second complementary feedback signal fbnN from the previous stage to the next stage, it is beneficial to enhance the driving capabilities of the first complementary feedback signal fbpN and the second complementary feedback signal fbnN to the next stage circuit for receiving data 100 through the third NAND gate 1142 and the fourth NAND gate 1242.

In another example, when the plurality of circuits for receiving data 100 are cascaded, the first output signal Vout and the second output signal VoutN outputted by the previous stage circuit for receiving data 100 are respectively used as the first feedback signal fbp and the second feedback signal fbn of the next stage circuit for receiving data 100, the third NAND gate 1142 in the next stage circuit for receiving data 100 converts the first feedback signal fbp into the first complementary feedback signal fbpN and provides same to the gate of the second NMOS transistor MN2 and the gate of the fifth NMOS transistor MN5 at this stage, and the fourth NAND gate 1242 in the next stage circuit for receiving data 100 converts the second feedback signal fbn into the second complementary feedback signal fbnN and provides same to the gate of the fourth NMOS transistor MN4 and the gate of the seventh NMOS transistor MN7 at this stage. Moreover, the third NAND gate 1142 may be arranged close to the gate of the second NMOS transistor MN2 and the gate of the fifth NMOS transistor MN5, and the fourth NAND gate 1242 may be arranged close to the gate of the fourth NMOS transistor MN4 and the gate of the seventh NMOS transistor MN7.

The specific working principle of the circuit for receiving data 100 provided by one embodiment of the present disclosure will be described in detail below with reference to FIG. 5, FIG. 7, and Table 1.

In one example, when the plurality of circuits for receiving data 100 are cascaded, the first output signal Vout outputted by the first output node net9 of a previous stage circuit for receiving data 100 is used as the first feedback signal fbp of a next stage circuit for receiving data 100, and the second output signal VoutN outputted by the second output node net10 of the previous stage circuit for receiving data 100 is used as the second feedback signal fbn of the next stage circuit for receiving data 100.

The following description is given by taking an example where the level of the received first reference signal VR+ is greater than the level of the second reference signal VR−. The data signal DQ being at a logic level 1 indicates that the level of the data signal DQ is greater than the level of the first reference signal VR+, and the data signal DQ being at a logic level 0 indicates that the level of the data signal DQ is less than the level of the second reference signal VR−. It should be noted that in Table 1, 1 represents a high level, and 0 represents a low level.

When the influence of the intersymbol interference on the circuit for receiving data 100 needs to be considered, the enable signal EnDfe is at a high level. At this time, the first NMOS transistor MN1 and the third NMOS transistor MN3 are turned on, the second NMOS transistor MN2 is turned on or off in response to the first complementary feedback signal fbpN, and the fourth NMOS transistor MN4 is turned on or off in response to the second complementary feedback signal fbnN.

Referring to Table 1, if the data signal DQ1 received by the previous stage circuit for receiving data 100 is at a logic level 1, the first output signal Vout outputted by the previous stage circuit for receiving data 100, namely the first feedback signal fbp of the next stage circuit for receiving data 100 is at a high level, and the second output signal VoutN outputted by the previous stage circuit for receiving data 100, namely the second feedback signal fbn of the next stage circuit for receiving data 100 is at a low level. At this time, the first complementary feedback signal fbpN is at a low level, the second complementary feedback signal fbnN is at a high level, the second NMOS transistor MN2 is turned off, the fourth NMOS transistor MN4 is turned on, the first amplification module 101 performs the first comparison, and the first node net1 and the second node net2 output the first signal Sn+ and the second signal Sp+. The first input unit 112 is configured to perform third comparison on the first signal Sn+ and the second signal Sp+, to provide a signal to the seventh node net7 and a signal to the eighth node net8, and there is no current flowing through the second input unit 122.

When the data signal DQ1 received by the previous stage circuit for receiving data 100 is at a logic level 1, the data signal DQ2 received by the next stage circuit for receiving data 100 is in the following two cases:

Case 1: referring to Table 1, when the data signal DQ2 received by the next stage circuit for receiving data 100 is at a logic level 0, the data signal DQ2 received by the next stage circuit for receiving data 100 and the data signal DQ1 received by the previous stage circuit for receiving data 100 have a great level difference, and there is great intersymbol interference. At this time, the first amplification module 101 in the next stage circuit for receiving data 100 performs the first comparison to output the first signal Sn+ and the second signal Sp+, such that the first input unit 112 is turned on, that is, the second amplification module 102 in the next stage circuit for receiving data 100 receives the first signal Sn+ and the second signal Sp+. At this time, in the next stage circuit for receiving data 100, the data signal DQ2 is at a logic level 0, and the voltage difference between the data signal DQ2 and the first reference signal VR+ is greater than the voltage difference between the data signal DQ2 and the second reference signal VR−. If the second comparison may be performed at this time, the level difference between the signals in the valid first signal pair obtained by performing the first comparison is greater than the level difference between the signals in the valid second signal pair obtained by performing the second comparison. At this time, the second amplification module 102 receives the valid first signal pair, more facilitating outputting the first output signal Vout and the second output signal VoutN having higher accuracy, to achieve the purpose of reducing the influence of the intersymbol interference of the received data signal DQ on the circuit for receiving data 100; and at this time, the second comparison is not performed, which facilitates reducing the power consumption of the circuit for receiving data 100.

Case 2: referring to Table 1, when the data signal DQ2 received by the next stage circuit for receiving data 100 is at a logic level 1, the data signal DQ2 received by the next stage circuit for receiving data 100 and the data signal DQ1 received by the previous stage circuit for receiving data 100 have a small level difference, and there is small or no intersymbol interference. At this time, the first amplification module 101 in the next stage circuit for receiving data 100 performs the first comparison to output the first signal Sn+ and the second signal Sp+, such that the first input unit 112 is turned on, that is, the second amplification module 102 in the next stage circuit for receiving data 100 receives the first signal Sn+ and the second signal Sp+.

Referring to Table 1, if the data signal DQ1 received by the previous stage circuit for receiving data 100 is at a logic level 0, the first output signal Vout outputted by the previous stage circuit for receiving data 100, namely the first feedback signal fbp of the next stage circuit for receiving data 100 is at a low level, and the second output signal VoutN outputted by the previous stage circuit for receiving data 100, namely the second feedback signal fbn of the next stage circuit for receiving data 100 is at a high level. At this time, the first complementary feedback signal fbpN is at a high level, the second complementary feedback signal fbnN is at a low level, the second NMOS transistor MN2 is turned on, the fourth NMOS transistor MN4 is turned off, the first amplification module 101 performs the second comparison, and the third node net3 and the fourth node net4 output the third signal Sn− and the fourth signal Sp−. The second input unit 122 is configured to perform fourth comparison on the third signal Sn− and the fourth signal Sp−, to provide a signal to the seventh node net7 and a signal to the eighth node net8, and there is no current flowing through the first input unit 112.

When the data signal DQ1 received by the previous stage circuit for receiving data 100 is at a logic level 0, the data signal DQ2 received by the next stage circuit for receiving data 100 is in the following two cases:

Case 3: referring to Table 1, when the data signal DQ2 received by the next stage circuit for receiving data 100 is at a logic level 0, the data signal DQ2 received by the next stage circuit for receiving data 100 and the data signal DQ1 received by the previous stage circuit for receiving data 100 have a small level difference, and there is small or no intersymbol interference. At this time, the first amplification module 101 in the next stage circuit for receiving data 100 performs the second comparison to output the third signal Sn− and the fourth signal Sp−, such that the second input unit 122 is turned on, that is, the second amplification module 102 in the next stage circuit for receiving data 100 receives the third signal Sn− and the fourth signal Sp−.

Case 4: referring to Table 1, when the data signal DQ2 received by the next stage circuit for receiving data 100 is at a logic level 1, the data signal DQ2 received by the next stage circuit for receiving data 100 and the data signal DQ1 received by the previous stage circuit for receiving data 100 have a great level difference, and there is great intersymbol interference. At this time, the first amplification module 101 in the next stage circuit for receiving data 100 performs the second comparison to output the third signal Sn− and the fourth signal Sp−, such that the second input unit 122 is turned on, that is, the second amplification module 102 in the next stage circuit for receiving data 100 receives the third signal Sn− and the fourth signal Sp−. At this time, in the next stage circuit for receiving data 100, the data signal DQ2 is at a logic level 1, and the voltage difference between the data signal DQ2 and the second reference signal VR− is greater than the voltage difference between the data signal DQ2 and the first reference signal VR+. If the first comparison may be performed at this time, the level difference between the signals in the valid second signal pair obtained by performing the second comparison is greater than the level difference between the signals in the valid first signal pair obtained by performing the first comparison. At this time, the second amplification module 102 receives the valid second signal pair, more facilitating outputting the first output signal Vout and the second output signal VoutN having higher accuracy, to achieve the purpose of reducing the influence of the intersymbol interference of the received data signal DQ on the circuit for receiving data 100; and at this time, the first comparison is not performed, which facilitates reducing the power consumption of the circuit for receiving data 100.

first NMOS transistor MN1 and the third PMOS transistor MN3 are both turned off, the first amplification module 101 regularly performs the first comparison to output the first signal Sn+ and the second signal Sp+, and the first input unit 112 is turned on or off in response to the first signal pair. At this time, the third signal Sn− and the fourth signal Sp− outputted by the second comparison circuit 121 are both logic low-level signals, such that the second input unit 122 in response to the third signal Sn− and the fourth signal Sp− is turned off.

It should be noted that, in the above description about the high level and the low level, the high level may be a level greater than or equal to a power supply voltage, and the low level may be a level less than or equal to a ground voltage. Moreover, the high level and the low level are relative, and the specific level range contained in the high level and the low level may be determined according to a specific device. For example, for an NMOS transistor, the high level refers to the level range of a gate voltage that can turn on the NMOS transistor, and the low level refers to the level range of a gate voltage that can turn off the NMOS transistor. For a PMOS transistor, the low level refers to the level range of a gate voltage that can turn on the PMOS transistor, and the high level refers to the level range of a gate voltage that can turn off the PMOS transistor. Furthermore, the high level may be the logic level 1 in the foregoing description, and the low level may be the logic level 0 in the foregoing description.

In conclusion, the first amplification module 101 may be further controlled using the enable signal EnDfe, the first feedback signal fbp, and the second feedback signal fbn, to select whether to consider the influence of the intersymbol interference of the data received by the circuit for receiving data 100 on the circuit for receiving data 100. For example, when the influence of the intersymbol interference on the circuit for receiving data 100 needs to be reduced, when the enable signal EnDfe is at the first level, the first amplification module 101 selects to perform one of the first comparison and the second comparison in response to the sampling clock signal clkN by using the first NMOS transistor MN1, the second NMOS transistor MN2, the third NMOS transistor MN3, and the fourth NMOS transistor MN4, such that one of the outputted first signal pair and second signal pair is valid, the other one is invalid, and the signal level difference in the valid signal pair is greater, to ensure that the second amplification module 102 receives the pair of differential signals having a greater signal level difference. In addition, the use of a low turn-on resistance of the NMOS transistors prevents the first amplification module 101 from performing the first comparison and the second comparison

TABLE 1

| Data signal DQ1 received by a previous stage data transmission circuit | Data signal DQ2 received by a next stage data transmission circuit | First feedback signal fbp received by a next stage data transmission circuit | Second feedback signal fbn received by a next stage data transmission circuit | Signal pair received by a second amplification module in a next stage data transmission circuit |
|---|---|---|---|---|
| 1 | 0 | 1 | 0 | Sn+, Sp+ |
| 1 | 1 | 1 | 0 | Sn+, Sp+ |
| 0 | 0 | 0 | 1 | Sn−, Sp− |
| 0 | 1 | 0 | 1 | Sn−, Sp− |

When the influence of the intersymbol interference on the circuit for receiving data 100 does not need to be considered, the enable signal EnDfe is at a low level. At this time, the at the same time and improves the processing effect and processing speed of the first amplification module 101 to the data signal DQ. When the influence of the intersymbol interference on the circuit for receiving data 100 does not need to be considered, when the enable signal EnDfe is at the second level, the first amplification module 101 only performs the first comparison in response to the sampling clock signal clkN to regularly output the valid first signal pair, thereby reducing the power consumption of the circuit for receiving data 100.

Another embodiment of the present disclosure provides a system for receiving data. The system for receiving data provided by another embodiment of the present disclosure will be described in detail below with reference to the accompanying drawings. FIG. 9 is a functional block diagram of a system for receiving data according to another embodiment of the present disclosure.

Referring to FIG. 9, the system for receiving data includes: a plurality of cascaded data transmission circuits 120, where each of the data transmission circuits 120 includes the circuit for receiving data 100 as described above, and a latch circuit 110 connected to the circuit for receiving data 100; an output signal of a previous stage data transmission circuit 120 is used as the feedback signal fb of a next stage data transmission circuit 120; and an output signal of a last stage data transmission circuit 120 is used as the feedback signal fb of a first stage data transmission circuit 120. The latch circuits 110 and the circuits for receiving data 100 are arranged in one-to-one correspondence, and the latch circuits 110 are configured to latch and output signals outputted by the circuits for receiving data 100 corresponding to the latch circuits 110.

In some embodiment, the circuits for receiving data 100 receive data in response to sampling clock signals; and the system for receiving data includes four cascaded circuits for receiving data 100, and the sampling clock signals clkN of the circuits for receiving data 100 of adjacent stages have a phase difference of 90 degrees. Thus, the cycle of the sampling clock signals clkN is twice the cycle of the data signals DQ received by data ports, thereby facilitating clock routing and saving of power consumption.

It should be noted that, in FIG. 9, taking an example where the system for receiving data includes cascaded four of the circuits for receiving data 100, and the sampling clock signals of adjacent stages of the circuits for receiving data 100 have a phase difference of 90 degrees, in practical applications, the number of the cascaded circuits for receiving data 100 included in the system for receiving data is not limited, and the phase difference of the sampling clock signals of adjacent stages of circuits for receiving data 100 may be reasonably set on the basis of the number of the cascaded circuits for receiving data 100.

In some embodiment, the first output signal Vout and the second output signal VoutN outputted by the second amplification module 102 of the previous stage circuit for receiving data 100 are used as the feedback signal fb of a next stage circuit for receiving data. Thus, the output of the circuit for receiving data 100 is directly transmitted to the next stage data transmission circuit 120 without passing through the latch circuit 110, thereby facilitating reducing the delay of data transmission. Or, the signal outputted by the previous stage of latch circuit 110 is used as the feedback signal fb of the next stage circuit for receiving data 100.

In conclusion, the system for receiving data provided by another embodiment of the present disclosure may further control the first amplification module 101 using the enable signal EnDfe, the first feedback signal fbp, and the second feedback signal fbn, to select whether to consider the influence of the intersymbol interference of the data received by the circuit for receiving data 100 on the circuit for receiving data 100. For example, when the influence of the intersymbol interference on the circuit for receiving data 100 needs to be reduced, when the enable signal EnDfe is at the first level, the first amplification module 101 selects to perform the first comparison or the second comparison in response to the sampling clock signal clkN on the basis of the first feedback signal fbp and the second feedback signal fbn, such that one of the outputted first signal pair and second signal pair is valid, the other one is invalid, and the signal level difference in the valid signal pair is greater, to ensure that the second amplification module 102 receives the pair of differential signals having a greater signal level difference. In addition, the use of a low turn-on resistance of the NMOS transistors prevents the first amplification module 101 from performing the first comparison and the second comparison at the same time and improves the processing effect and processing speed of the first amplification module 101 to the data signal DQ. When the influence of the intersymbol interference on the circuit for receiving data 100 does not need to be considered, when the enable signal EnDfe is at the second level, the first amplification module 101 only performs the first comparison in response to the sampling clock signal clkN to regularly output the valid first signal pair, thereby reducing the power consumption of the circuit for receiving data 100.

Another embodiment of the present disclosure also provides a memory device, including: a plurality of data ports; and a plurality of systems for receiving data as described above, each of the systems for receiving data corresponding to one of the data ports. Thus, when the influence of the intersymbol interference on the memory device needs to be reduced, each of the data ports in the memory device may flexibly adjust the received data signal DQ through the system for receiving data, to improve the adjustability to the first output signal Vout and the second output signal VoutN, thereby improving the receiving performance of the memory device. When the influence of the intersymbol interference on the memory device does not need to be considered, when the enable signal EnDfe is at the second level, the first amplification module 101 only performs the first comparison in response to the sampling clock signal clkN and regularly outputs the valid first signal pair, thereby reducing the power consumption of the memory device.

Those skilled in the art can understand that the above implementations are specific embodiments for implementing the present disclosure. In practical applications, various changes may be made to the above embodiments in terms of form and details without departing from the spirit and scope of the embodiments of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A circuit for receiving data, comprising:
a first amplification module, configured to: receive an enable signal, a first feedback signal, a second feedback signal, a data signal, a first reference signal, and a second reference signal; when the enable signal is at a first level, in response to a sampling clock signal and on a basis of the first feedback signal, select the data signal and the first reference signal for a first comparison and output a first signal pair as a result of the first comparison, or in response to the sampling clock signal and on a basis of the second feedback signal, select the data signal and the second reference signal for a second comparison and output a second signal pair as a result of the second comparison; and when the enable signal is at a second level, perform the first comparison in response to the sampling clock signal, and output the first signal pair; wherein, a level of the first feedback signal is opposite to a level of the second feedback signal, the first signal pair comprises a first signal and a second signal, and the second signal pair comprises a third signal and a fourth signal; and the first amplification module comprises: an amplification unit, provided with a first node, a second node, a third node and a fourth node, the first node being for outputting the first signal, the second node being for outputting the second signal, the third node being for outputting the third signal, and the fourth node being for outputting the fourth signal, and configured to receive the data signal, the first reference signal, and the second reference signal; a first N-channel metal oxide semiconductor (NMOS) transistor and a second NMOS transistor, the first NMOS transistor being provided with one terminal connected to the first node and another terminal connected to one terminal of the second NMOS transistor, another terminal of the second NMOS transistor being connected to the second node, a gate of one of the first NMOS transistor and the second NMOS transistor being configured to receive a first complementary feedback signal, a gate of the other one of the first NMOS transistor and the second NMOS transistor being configured to receive the enable signal, and a level of the first complementary feedback signal being opposite to the level of the first feedback signal; and a third NMOS transistor and a fourth NMOS transistor, the third NMOS transistor being provided with one terminal connected to the third node and another terminal connected to one terminal of the fourth NMOS transistor, another terminal of the fourth NMOS transistor being connected to the fourth node, a gate of one of the third NMOS transistor and the fourth NMOS transistor being configured to receive a second complementary feedback signal, a gate of the other one of the third NMOS transistor and the fourth NMOS transistor being configured to receive the enable signal, and a level of the second complementary feedback signal being opposite to the level of the second feedback signal; and a second amplification module, configured to receive output signals of the first amplification module as an input signal pair, perform an amplification processing on a voltage difference of the input signal pair, and output a first output signal and a second output signal as a result of the amplification processing.

2. The circuit for receiving data according to claim 1, wherein the first amplification module further comprises:

a fifth NMOS transistor and a sixth NMOS transistor, the fifth NMOS transistor being provided with one terminal connected to the first node and another terminal connected to one terminal of the sixth NMOS transistor, another terminal of the sixth NMOS transistor being connected to the second node, a gate of one of the fifth NMOS transistor and the sixth NMOS transistor being configured to receive the first complementary feedback signal, and a gate of the other one of the fifth NMOS transistor and the sixth NMOS transistor being configured to receive the enable signal.

3. The circuit for receiving data according to claim 2, wherein a gate of the first NMOS transistor is configured to receive the enable signal, and a gate of the second NMOS transistor is configured to receive the first complementary feedback signal, wherein a channel width of the first NMOS transistor is greater than a channel width of the second NMOS transistor; a gate of the fifth NMOS transistor is configured to receive the first complementary feedback signal, and a gate of the sixth NMOS transistor is configured to receive the enable signal, wherein a channel width of the fifth NMOS transistor is smaller than a channel width of the sixth NMOS transistor; and the channel width of the fifth NMOS transistor is equal to the channel width of the second NMOS transistor; the channel width of the sixth NMOS transistor is equal to the channel width of the first NMOS transistor; and a channel length of the first NMOS transistor, a channel length of the second NMOS transistor, a channel length of the fifth NMOS transistor, and a channel length of the sixth NMOS transistor are all equal.

4. The circuit for receiving data according to claim 1, wherein the first amplification module further comprises:

a seventh NMOS transistor and an eighth NMOS transistor, the seventh NMOS transistor being provided with one terminal connected to the third node and another terminal connected to one terminal of the eighth NMOS transistor, another terminal of the eighth NMOS transistor being connected to the fourth node, a gate of one of the seventh NMOS transistor and the eighth NMOS transistor being configured to receive the second complementary feedback signal, and a gate of the other one of the seventh NMOS transistor and the eighth NMOS transistor being configured to receive the enable signal.

5. The circuit for receiving data according to claim 4, wherein a gate of the third NMOS transistor is configured to receive the enable signal, and a gate of the fourth NMOS transistor is configured to receive the second complementary feedback signal, wherein a channel width of the third NMOS transistor is greater than a channel width of the fourth NMOS transistor; a gate of the seventh NMOS transistor is configured to receive the second complementary feedback signal, and a gate of the eighth NMOS transistor is configured to receive the enable signal, wherein a channel width of the seventh NMOS transistor is smaller than a channel width of the eighth NMOS transistor; and the channel width of the seventh NMOS transistor is equal to the channel width of the fourth NMOS transistor; the channel width of the eighth NMOS transistor is equal to the channel width of the third NMOS transistor; and a channel length of the third NMOS transistor, a channel length of the fourth NMOS transistor, a channel length of the seventh NMOS transistor, and a channel length of the eighth NMOS transistor are all equal.

6. The circuit for receiving data according to claim 1, wherein the sampling clock signal comprises a first sampling clock signal and a second sampling clock signal; and the amplification unit comprises:

a first comparison circuit, provided with the first node and the second node, and configured to receive the data signal and the first reference signal and perform the first comparison in response to the first sampling clock signal;

a clock generation circuit, configured to receive the enable signal and an original sampling clock signal and output the second sampling clock signal, wherein when the enable signal is at the first level, a phase of the second sampling clock signal is opposite to a phase of the original sampling clock signal, and when the enable signal is at the second level, the second sampling clock signal is a logic high-level signal; and a second comparison circuit, provided with the third node and the fourth node, and configured to: receive the data signal and the second reference signal; when the enable signal is at the first level, perform the second comparison in response to the second sampling clock signal; and when the enable signal is at the second level, turn on a connection path between the third node and a ground terminal, and turn on a connection path between the fourth node and the ground terminal.

7. The circuit for receiving data according to claim 6, wherein the first comparison circuit comprises:

a first current source, connected between a power supply node and a fifth node and configured to provide a current to the fifth node in response to the first sampling clock signal;

a first comparison unit, connected to the first node, the second node, and the fifth node, and configured to receive the data signal and the first reference signal, perform the first comparison when the first current source provides the current to the fifth node, and output the first signal and the second signal; and a first reset unit, connected to the first node and the second node and configured to reset the first node and the second node in response to the first sampling clock signal; and the second comparison circuit comprises:

a second current source, connected between the power supply node and a sixth node and configured to provide a current to the sixth node in response to the second sampling clock signal;

a second comparison unit, connected to the third node, the fourth node, and the sixth node, and configured to receive the data signal and the second reference signal, perform the second comparison when the second current source provides the current to the sixth node, and output the third signal and the fourth signal; and a second reset unit, connected between the third node and the fourth node and configured to reset the third node and the fourth node in response to the second sampling clock signal.

8. The circuit for receiving data according to claim 7, wherein the first current source comprises:

a first P-channel metal oxide semiconductor (PMOS) transistor, connected between the power supply node and the fifth node and provided with a gate for receiving the first sampling clock signal;

the second current source comprises:

a second PMOS transistor, connected between the power supply node and the sixth node and provided with a gate for receiving the second sampling clock signal;

the first comparison unit comprises:

a third PMOS transistor, connected between the first node and the fifth node and provided with a gate for receiving the data signal; and a fourth PMOS transistor, connected between the second node and the fifth node and provided with a gate for receiving the first reference signal; and the second comparison unit comprises:

a fifth PMOS transistor, connected between the third node and the sixth node and provided with a gate for receiving the data signal; and a sixth PMOS transistor, connected between the fourth node and the sixth node and provided with a gate for receiving the second reference signal;

the first reset unit comprises:

a ninth NMOS transistor, connected between the first node and the ground terminal and provided with a gate for receiving the first sampling clock signal; and a tenth NMOS transistor, connected between the second node and the ground terminal and provided with a gate for receiving the first sampling clock signal; and the second reset unit comprises:

an eleventh NMOS transistor, connected between the third node and the ground terminal and provided with a gate for receiving the second sampling clock signal; and a twelfth NMOS transistor, connected between the fourth node and the ground terminal and provided with a gate for receiving the second sampling clock signal.

9. The circuit for receiving data according to claim 6, wherein the clock generation circuit comprises:

a first NAND gate circuit, provided with one input terminal for receiving the original sampling clock signal, the other input terminal connected to a power supply node, and an output terminal for outputting the first sampling clock signal; and the clock generation circuit comprises:

a second NAND gate circuit, provided with one input terminal for receiving the original sampling clock signal, the other input terminal for receiving the enable signal, and an output terminal for outputting the second sampling clock signal.

10. The circuit for receiving data according to claim 1, wherein the second amplification module comprises:

a first input unit, connected to a seventh node and an eighth node, and configured to receive the first signal pair for a third comparison and provide a signal to the seventh node and a signal to the eighth node respectively as a result of the third comparison;

a second input unit, connected to the seventh node and the eighth node, and configured to receive the second signal pair for a fourth comparison and provide a signal to the seventh node and a signal to the eighth node respectively as a result of the fourth comparison; and a latch unit, connected to the seventh node and the eighth node, and configured to amplify and latch a signal of the seventh node and a signal of the eighth node, and output the first output signal and the second output signal respectively through a first output node and a second output node.

11. The circuit for receiving data according to claim 10, wherein the first input unit comprises:

a thirteenth NMOS transistor, provided with a drain connected to the seventh node, a source connected to a ground terminal, and a gate for receiving the first signal; and a fourteenth NMOS transistor, provided with a drain connected to the eighth node, a source connected to the ground terminal, and a gate for receiving the second signal; and the second input unit comprises:

a fifteenth NMOS transistor, provided with a drain connected to the seventh node, a source connected to the ground terminal, and a gate for receiving the third signal; and a sixteenth NMOS transistor, provided with a drain connected to the eighth node, a source connected to the ground terminal, and a gate for receiving the fourth signal.

12. The circuit for receiving data according to claim 10, wherein the latch unit comprises:

a seventeenth NMOS transistor and a seventh P-channel metal oxide semiconductor (PMOS) transistor, a gate of the seventeenth NMOS transistor and a gate of the seventh PMOS transistor being both connected to the second output node, a source of the seventeenth NMOS transistor being connected to the seventh node, a drain of the seventeenth NMOS transistor and a drain of the seventh PMOS transistor being both connected to the first output node, and a source of the seventh PMOS transistor being connected to a power supply node; and an eighteenth NMOS transistor and an eighth PMOS transistor, a gate of the eighteenth NMOS transistor and a gate of the eighth PMOS transistor being both connected to the first output node, a source of the eighteenth NMOS transistor being connected to the eighth node, a drain of the eighteenth NMOS transistor and a drain of the eighth PMOS transistor being both connected to the second output node, and a source of the eighth PMOS transistor being connected to the power supply node.

13. The circuit for receiving data according to claim 12, wherein the second amplification module further comprises:
a third reset unit, connected between the power supply node and an output terminal of the latch unit and configured to reset the output terminal of the latch unit.

14. The circuit for receiving data according to claim 13, wherein the third reset unit comprises:
a ninth PMOS transistor, connected between the first output node and the power supply node and provided with a gate for receiving an original sampling clock signal; and
a tenth PMOS transistor, connected between the second output node and the power supply node and provided with a gate for receiving the original sampling clock signal.

15. The circuit for receiving data according to claim 1, further comprising:
a first inverter circuit, configured to receive the first feedback signal and output the first complementary feedback signal; and
a second inverter circuit, configured to receive the second feedback signal and output the second complementary feedback signal.

16. The circuit for receiving data according to claim 15, wherein the first inverter circuit comprises a first inverter; and the second inverter circuit comprises a second inverter; and
the first inverter circuit comprises a third NAND gate, and the third NAND gate is provided with two input terminals for respectively receiving the first feedback signal and the enable signal and an output terminal for outputting the first complementary feedback signal; and the second inverter circuit comprises a fourth NAND gate, and the fourth NAND gate is provided with two input terminals for respectively receiving the second feedback signal and the enable signal and an output terminal for outputting the second complementary feedback signal.

17. A system for receiving data, comprising:
a plurality of cascaded data transmission circuits, wherein each of the data transmission circuits comprises the circuit for receiving data according to claim 1, and a latch circuit connected to the circuit for receiving data;
an output signal of a previous stage data transmission circuit is used as a feedback signal of a next stage data transmission circuit; and
an output signal of a last stage data transmission circuit is used as a feedback signal of a first stage data transmission circuit.

18. The system for receiving data according to claim 17, wherein the circuit for receiving data receives data in response to a sampling clock signal; and the system for receiving data comprises four cascaded data transmission circuits, and sampling clock signals of circuits for receiving data of adjacent stages have a phase difference of 90 degrees.

19. The system for receiving data according to claim 17, wherein a first output signal and a second output signal outputted by a second amplification module of a previous stage circuit for receiving data are used as a feedback signal of a next stage circuit for receiving data; or, a signal outputted by a previous stage latch circuit is used as the feedback signal of the next stage circuit for receiving data.

20. A memory device, comprising:
a plurality of data ports; and
a plurality of systems for receiving data according to claim 17, each of the systems for receiving data corresponding to one of the data ports.

* * * * *